US012131954B1

(12) United States Patent
Shih et al.

(10) Patent No.: US 12,131,954 B1
(45) Date of Patent: Oct. 29, 2024

(54) SELECTIVE EPITAXY PROCESS FOR THE FORMATION OF CFET LOCAL INTERCONNECTION

(71) Applicant: Taiwan Semiconductor Manufacturing Co., Ltd., Hsinchu (TW)

(72) Inventors: Che Chi Shih, Taoyuan (TW); Hsin Yang Hung, New Taipei (TW); Ku-Feng Yang, Baoshan Township (TW); Wei-Yen Woon, Taoyuan (TW); Szuya Liao, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/531,047

(22) Filed: Dec. 6, 2023

(51) Int. Cl.
| | |
|---|---|
| *H01L 21/8238* | (2006.01) |
| *H01L 27/092* | (2006.01) |
| *H01L 29/06* | (2006.01) |
| *H01L 29/40* | (2006.01) |
| *H01L 29/423* | (2006.01) |
| *H01L 29/45* | (2006.01) |

(Continued)

(52) U.S. Cl.
CPC .... *H01L 21/823814* (2013.01); *H01L 27/092* (2013.01); *H01L 29/0673* (2013.01); *H01L 29/401* (2013.01); *H01L 29/42392* (2013.01); *H01L 29/456* (2013.01); *H01L 29/775* (2013.01); *H01L 29/78696* (2013.01)

(58) Field of Classification Search
CPC ........... H01L 21/823814; H01L 27/092; H01L 29/0673; H01L 29/401; H01L 29/42392; H01L 29/456; H01L 29/775; H01L 29/78696

USPC ......................................................... 257/369
See application file for complete search history.

(56) References Cited

U.S. PATENT DOCUMENTS

2022/0093593 A1* 3/2022 Yang .................... H10B 10/125
2022/0165730 A1* 5/2022 Chen ............... H01L 21/823814

(Continued)

OTHER PUBLICATIONS

Yasuda, T., et al., "Chemical vapor desposition of Si on chlorosilane-treated SiO2 surfaces. I. Suppresion and enhancement of Si nucleation," Journal of Applied Physics, vol. 90, No. 8, Oct. 15, 2001, 9 pages.

*Primary Examiner* — Tong-Ho Kim

(74) *Attorney, Agent, or Firm* — Slater Matsil, LLP

(57) ABSTRACT

A method includes forming Complementary Field-Effect Transistors including a lower transistor comprising a lower source/drain region, and an upper transistor including an upper source/drain region. An upper dielectric layer over the upper source/drain region and a lower dielectric layer under the upper source/drain region are etched to form an opening. A sidewall of the upper source/drain region and a top surface of the lower source/drain region are exposed to the opening. An epitaxy process is performed to form a first semiconductor layer on the sidewall of the upper source/drain region, and a second semiconductor layer on the top surface of the lower source/drain region. The first semiconductor layer is then removed. A contact plug is formed in the opening to electrically connects the upper source/drain region to the second semiconductor layer and the lower source/drain region.

20 Claims, 19 Drawing Sheets

(51) Int. Cl.
*H01L 29/775* (2006.01)
*H01L 29/786* (2006.01)

(56) References Cited

U.S. PATENT DOCUMENTS

| | | | |
|---|---|---|---|
| 2022/0216340 A1* | 7/2022 | Lin | H01L 21/823475 |
| 2023/0197800 A1* | 6/2023 | Dewey | H01L 21/823475 257/369 |

* cited by examiner

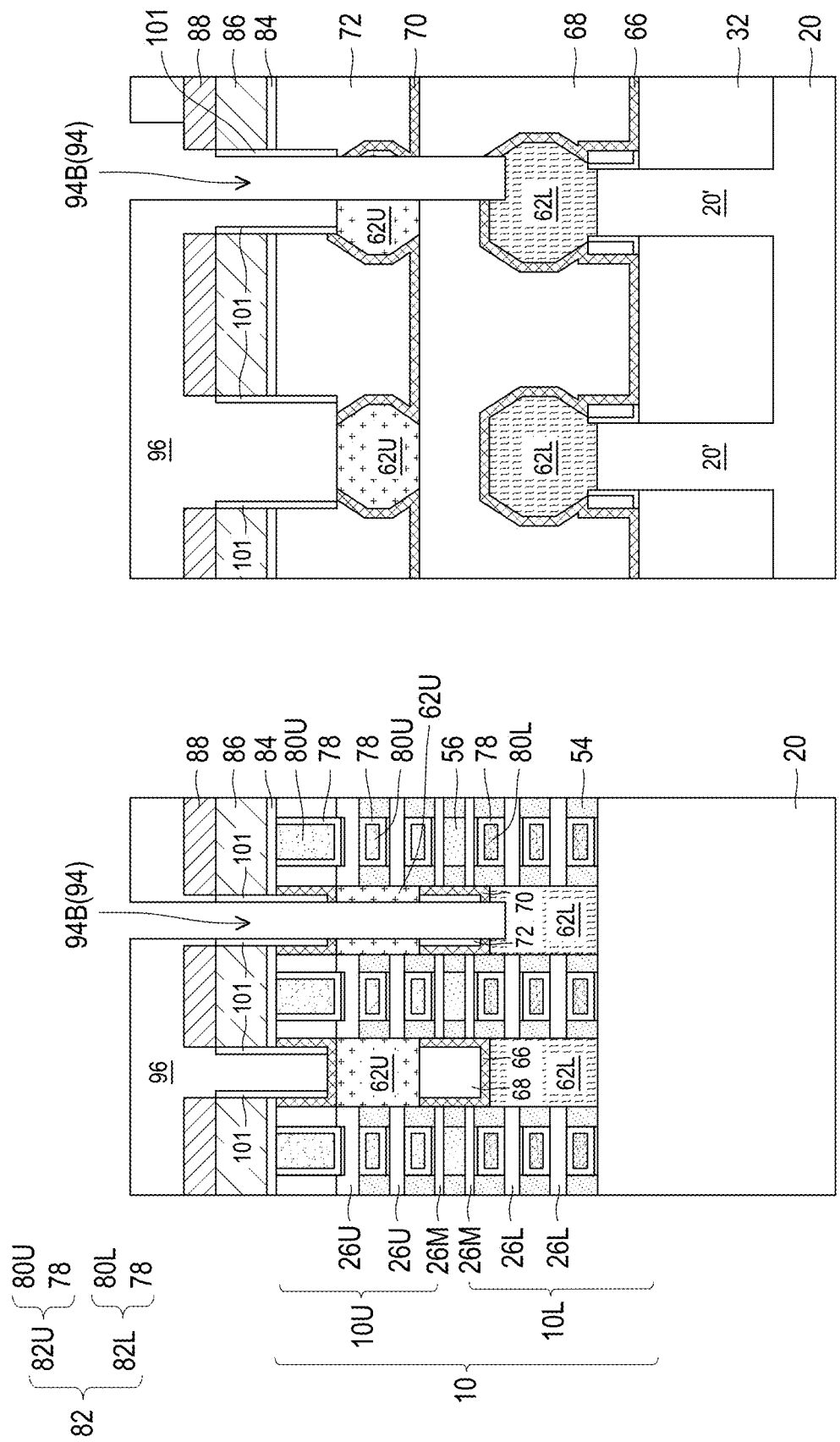

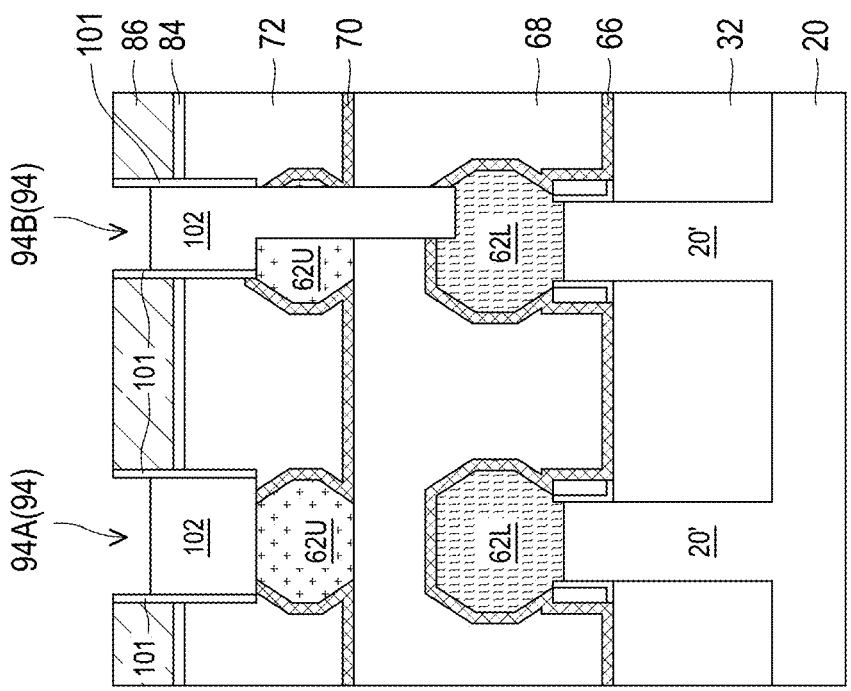
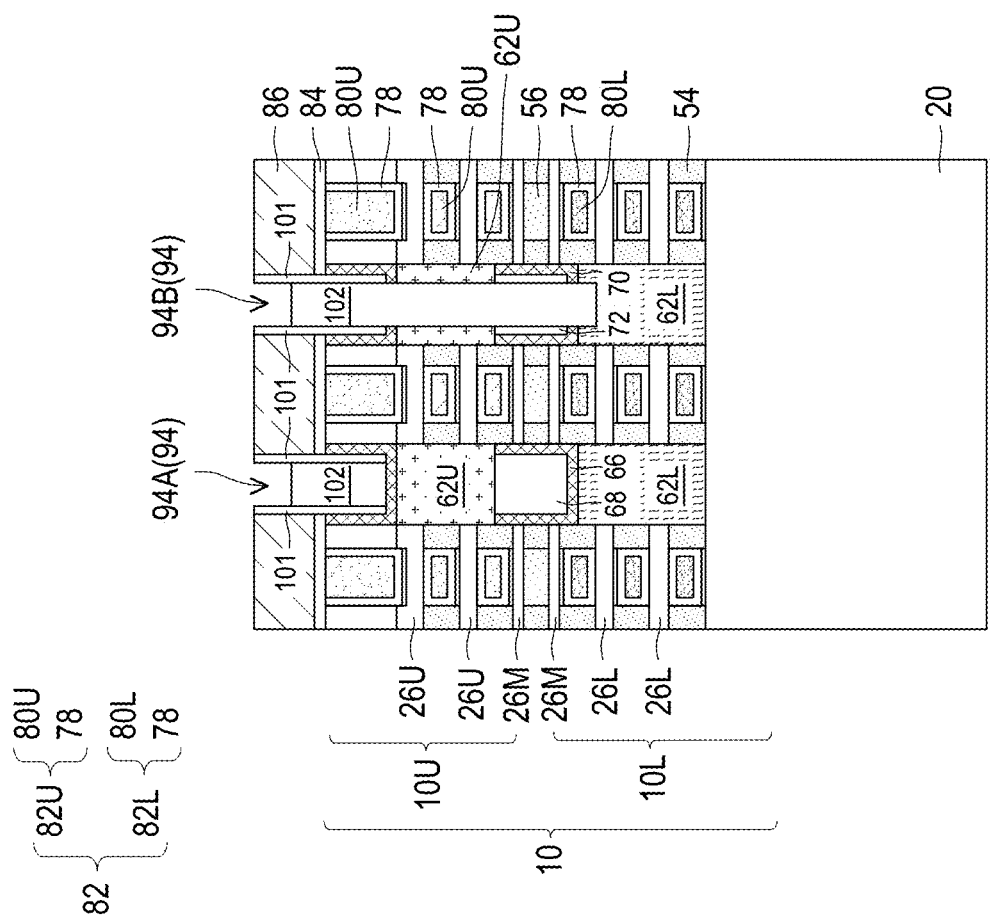
FIG. 12B
FIG. 12A

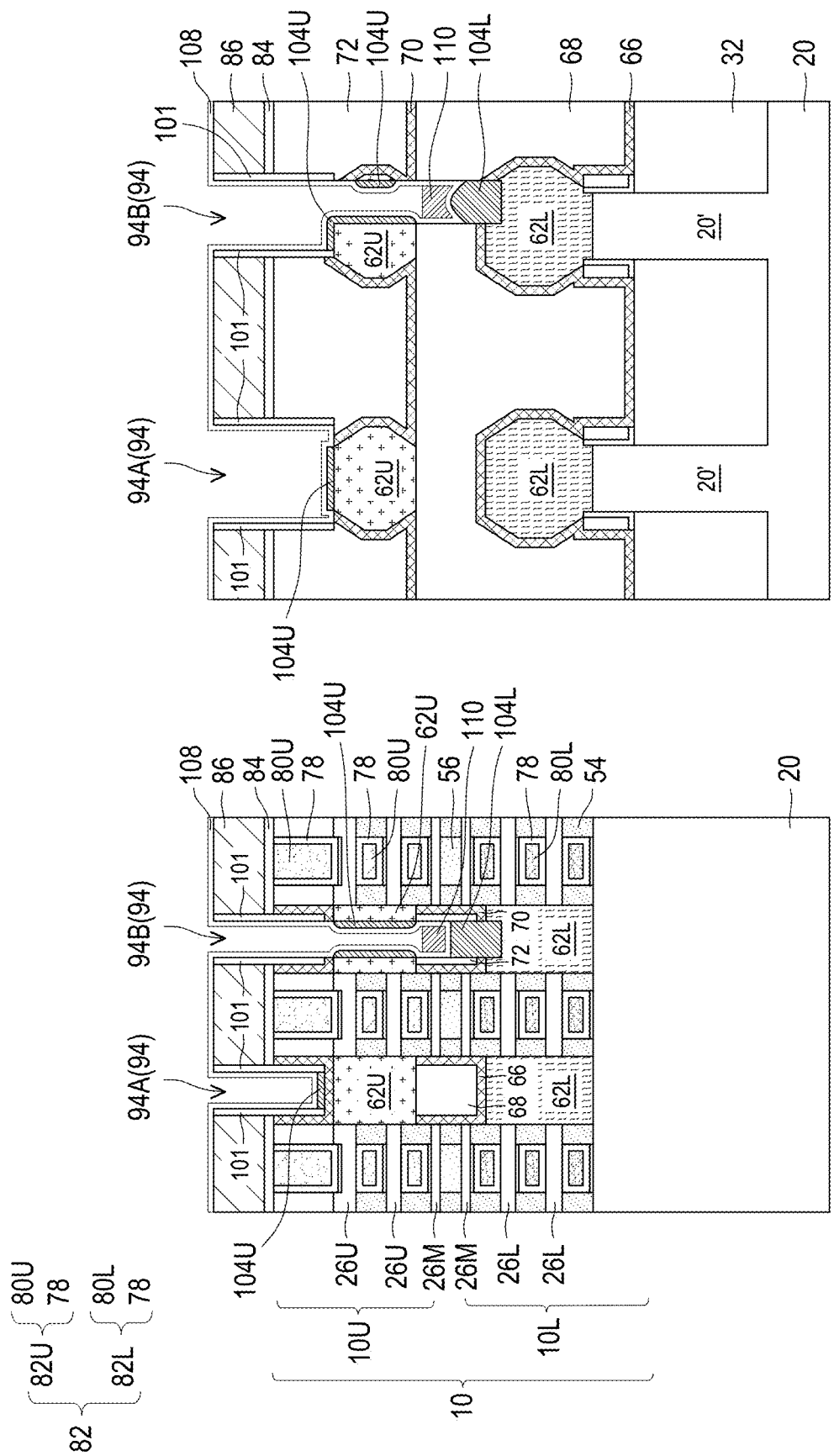

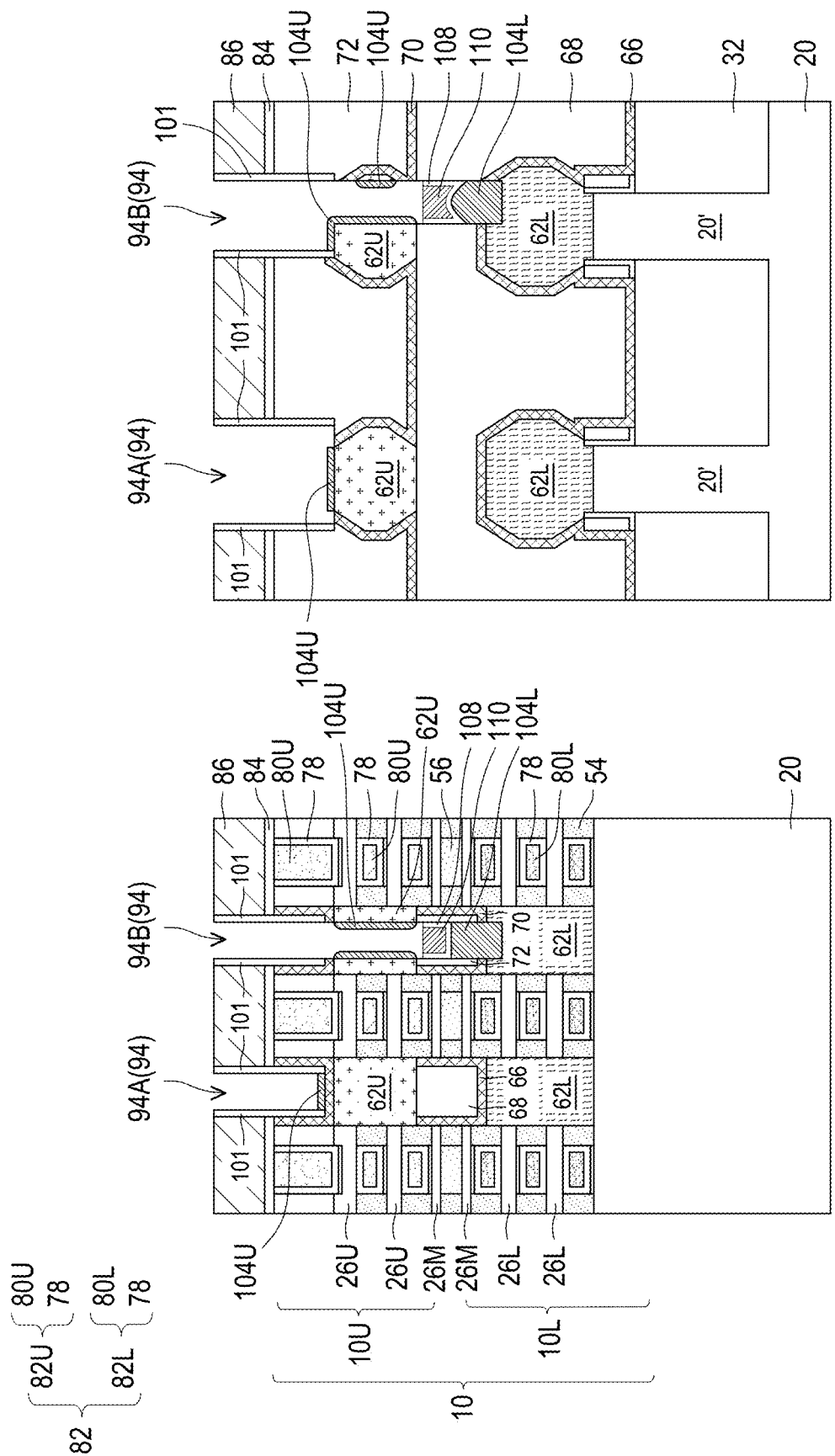

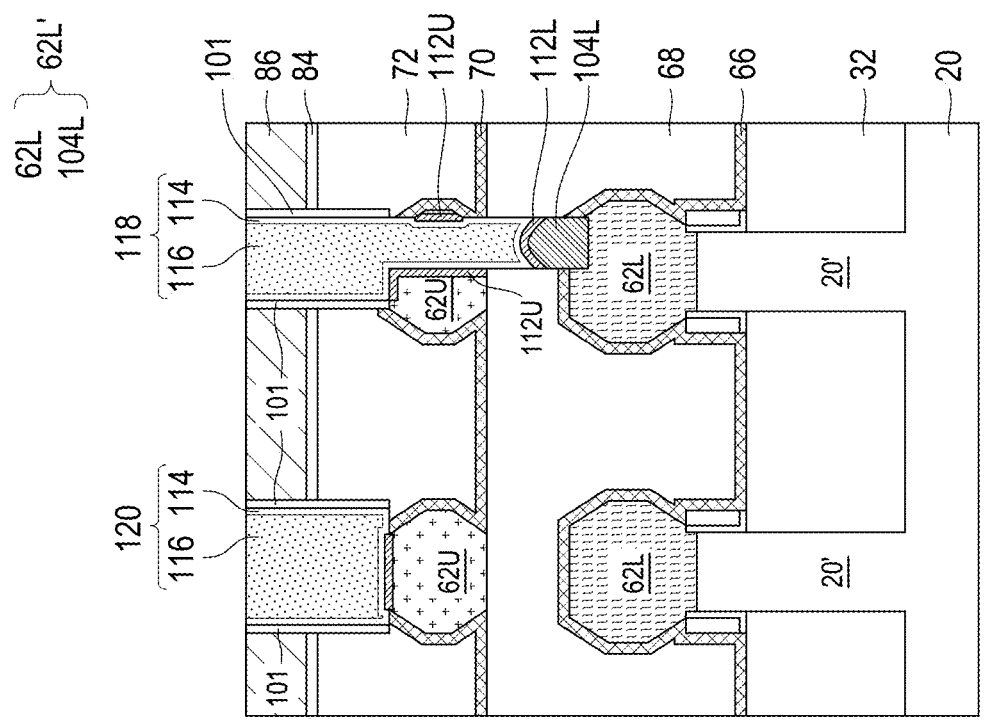
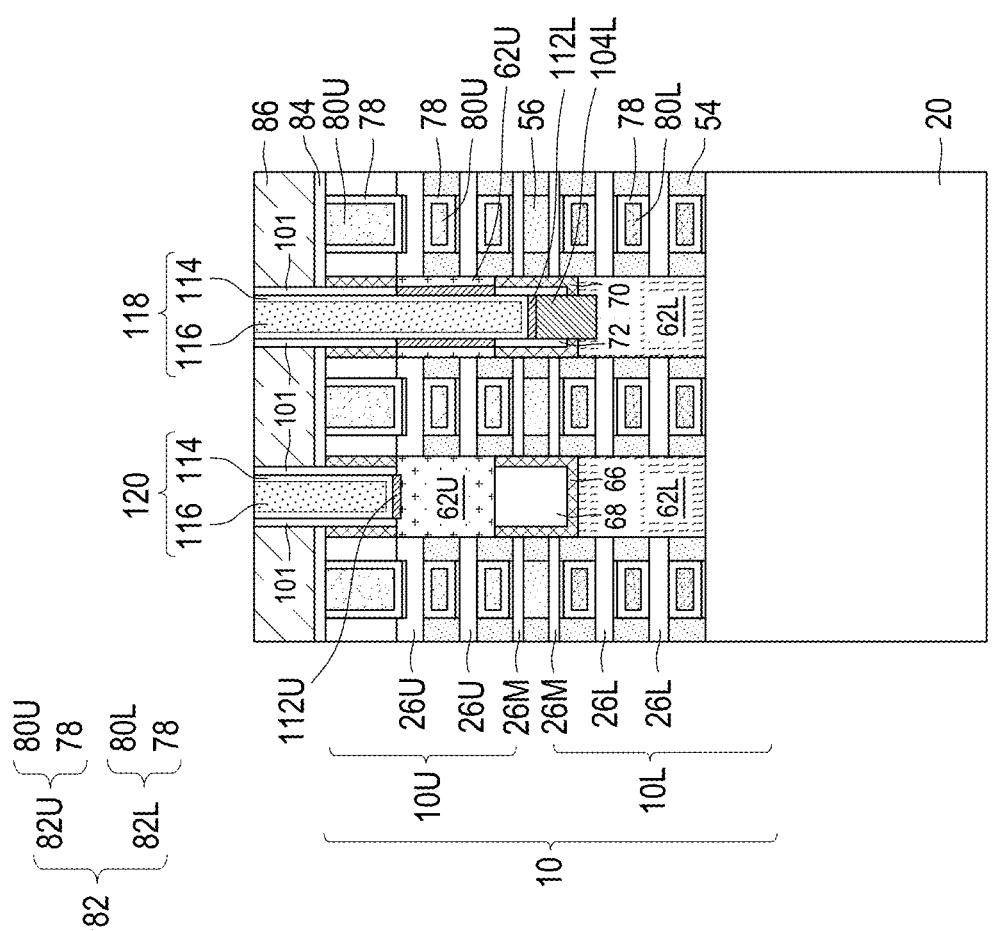
FIG. 18A
FIG. 18B

SELECTIVE EPITAXY PROCESS FOR THE FORMATION OF CFET LOCAL INTERCONNECTION

BACKGROUND

Complementary Field-Effect Transistors (CFETs) are being developed recently to meet the increasingly demanding requirements of increasing the density of transistors in integrated circuits. In the CFET circuits, upper transistors are formed overlapping lower transistors. To electrically connect to the lower transistors, contact plugs are formed. The contact plugs have high aspect ratios, and hence their formation faces challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B illustrate the views of intermediate stages in the formation of Complementary Field-Effect Transistors (CFETs) and contact plugs in accordance with some embodiments of the present disclosure.

DETAILED DESCRIPTION

Figure 1:
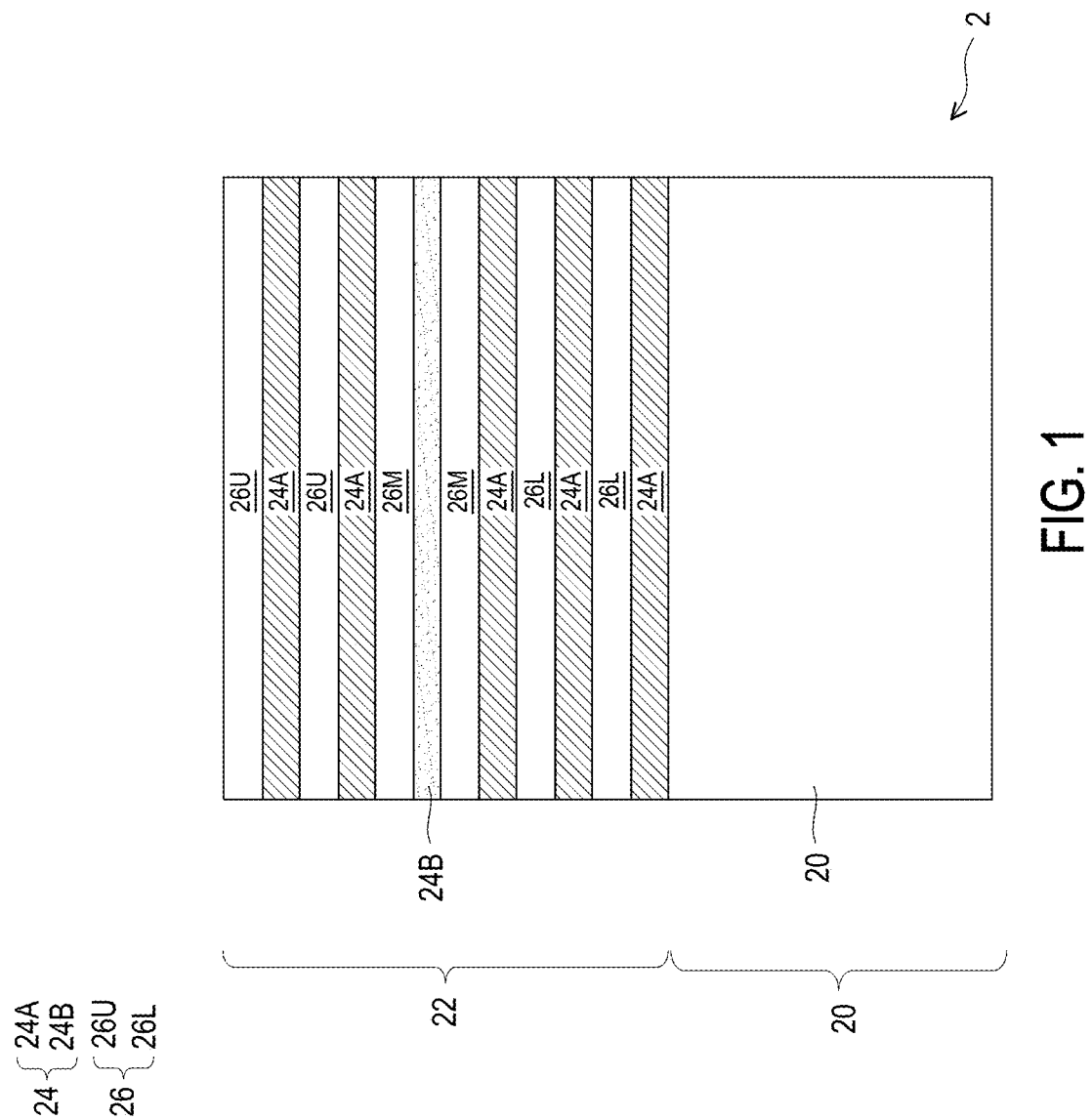

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A local interconnect, which includes a contact plug, for electrically connecting source/drain regions of an upper transistor and a lower transistor in Complementary Field-Effect Transistors (CFETs) is provided. The formation processes are also provided. In accordance with some embodiments of the present disclosure, a contact opening is formed to extend to a lower source/drain region of a lower transistor in the CFETs. An epitaxy layer is selectively formed on the lower source/drain region. The formation of the epitaxy layer causes the advantageous reduction of the aspect ratio of the opening, in which the contact plug is formed to electrically interconnect the lower source/drain region with an upper source/drain region.

It is appreciated that although Gate-All-Around (GAA) transistors are used as examples to explain the concept of the embodiments, the disclosure may also be applied to the CFETs formed of other transistors including, and not limited to, FinFETs, planar transistors, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-6, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B illustrate the views of intermediate stages in the formation of Complementary Field-Effect Transistors (CFETs) in accordance with some embodiments of the present disclosure. The corresponding processes are also reflected schematically in the process flow shown in FIG. 19.

Referring to FIG. 1, wafer 2, which includes substrate 20, is provided. Substrate 20 may be a semiconductor substrate, such as a bulk semiconductor, a semiconductor-on-insulator (SOI) substrate, or the like, which may be doped (e.g., with a p-type or an n-type dopant) or undoped.

Figure 19:
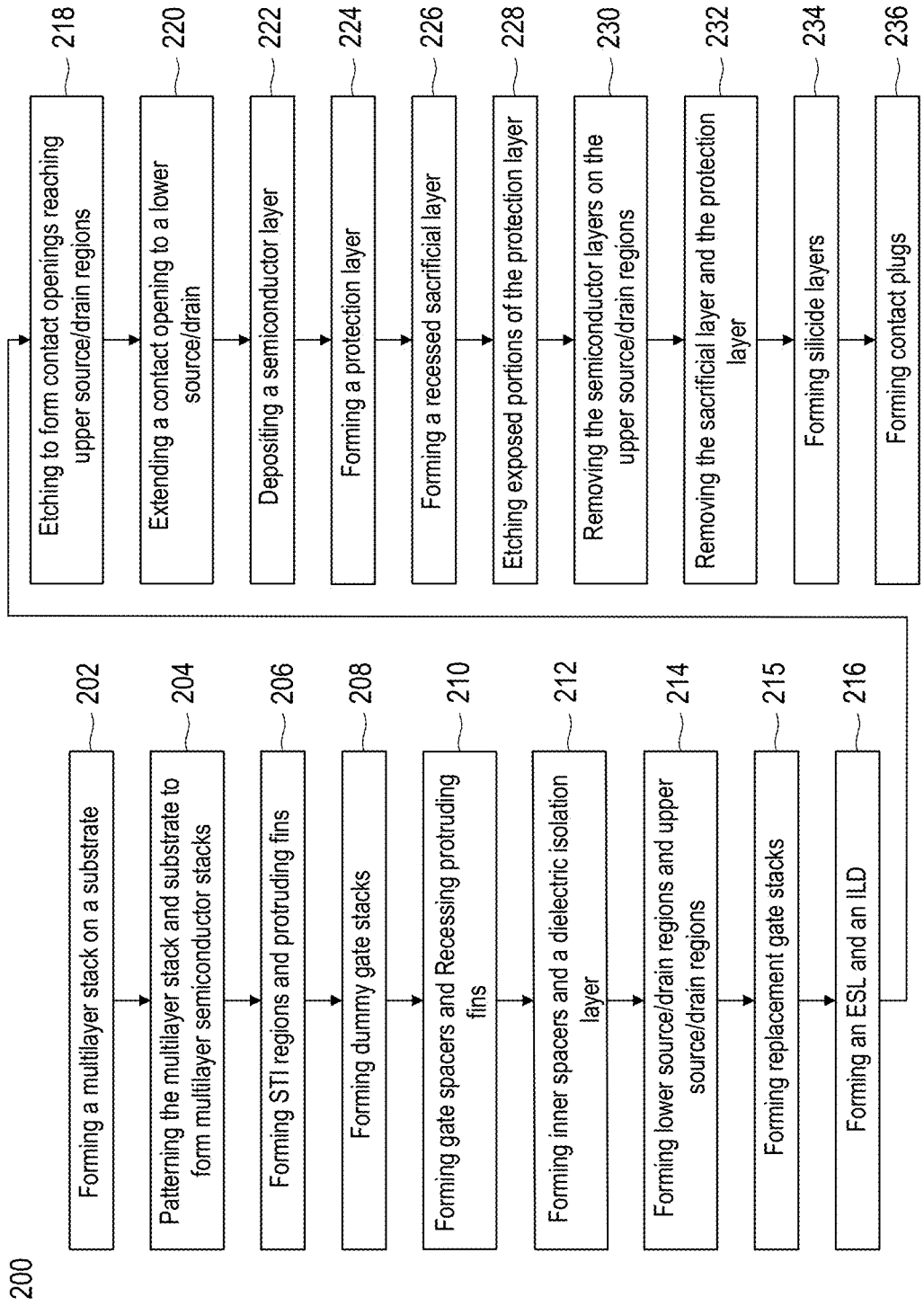
FIG. 19 illustrates a process flow for forming CFETs in accordance with some embodiments.

A multi-layer stack 22 is formed over the substrate 20. The respective process is illustrated as process 202 in the process flow 200 as shown in FIG. 19. The multi-layer stack 22 includes alternating dummy semiconductor layers 24 and semiconductor layers 26. Dummy semiconductor layers 24 include dummy semiconductor layers 24A and dummy semiconductor layer 24B. Semiconductor layers 26 include lower semiconductor nanostructures 26L and upper semiconductor nanostructures 26U. Lower semiconductor nanostructures 26L and upper semiconductor nanostructures 26U are for forming a lower FET and an upper FET, respectively.

The dummy semiconductor layers 24A are formed of a first semiconductor material, the dummy semiconductor layer(s) 24B are formed of a second semiconductor material different from the first semiconductor material. The first and second semiconductor materials may be selected from the same group of candidate semiconductor materials of the substrate 20. The first and second semiconductor materials have a high etching selectivity to one another. As such, the dummy semiconductor layer(s) 24B may be removed at a faster rate than the dummy semiconductor layers 24A in subsequent processes.

The semiconductor layers 26 (including the lower semiconductor nanostructures 26L and upper semiconductor nanostructures 26U) are formed of one or more semiconductor material(s). The semiconductor material(s) may also be selected from the same group of candidate semiconductor materials of the substrate 20. The lower semiconductor nanostructures 26L and the upper semiconductor nanostructures 26U may be formed of the same semiconductor material, or may be formed of different semiconductor materials.

In accordance with some embodiments, dummy semiconductor layers 24A are formed of or comprise silicon germanium, semiconductor layers 26 are formed of silicon, and dummy semiconductor layer 24B may be formed of germanium or silicon germanium that has a higher germanium atomic percentage than dummy semiconductor layers 24A.

Figure 2:
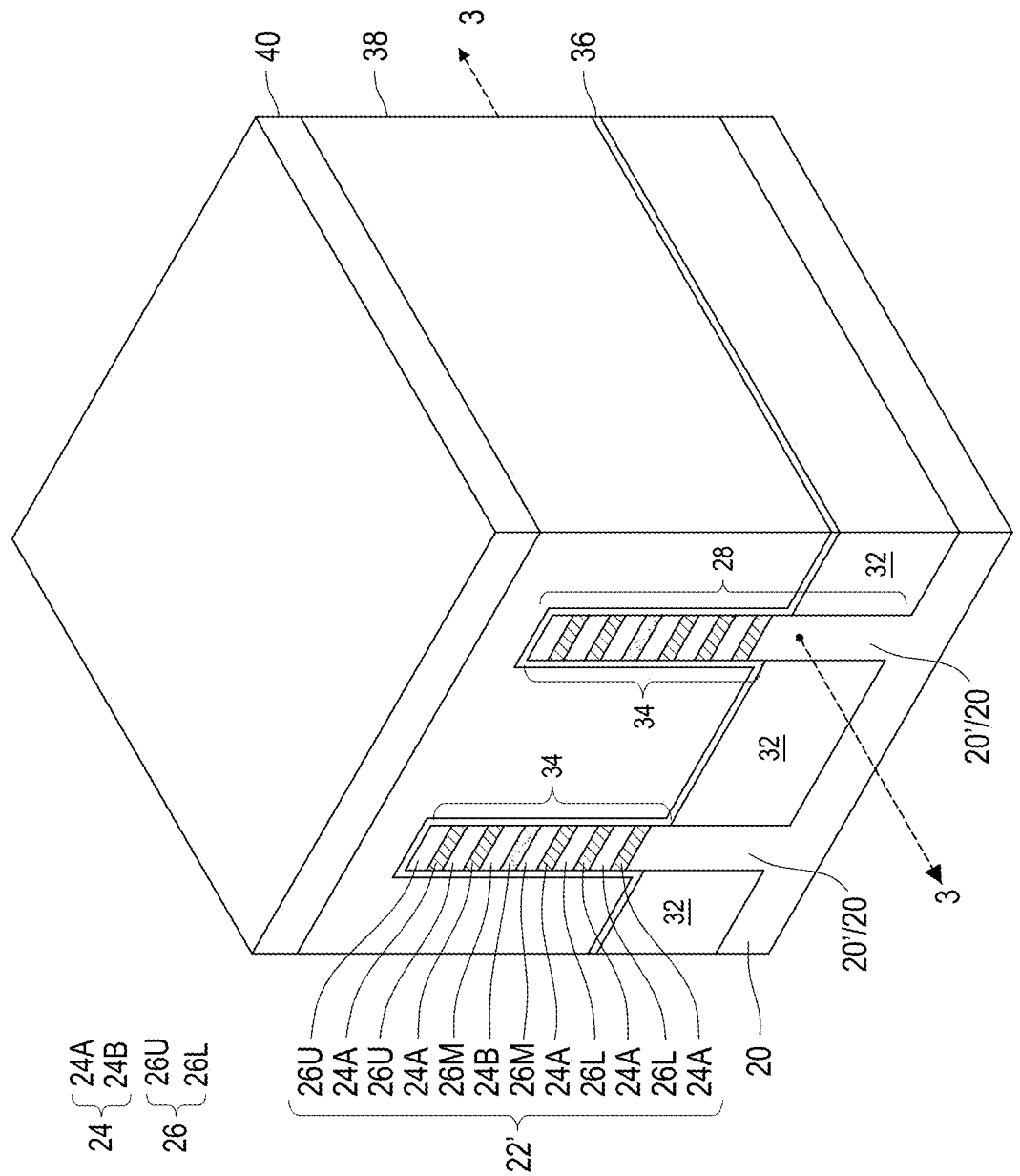

Referring to FIG. 2, multi-layer stack 22 and substrate 20 are patterned to form semiconductor strips 28. The respective process is illustrated as process 204 in the process flow 200 as shown in FIG. 19. Each of semiconductor strips 28 includes semiconductor strip 20' (FIG. 2, the portions of the original substrate 20) and multi-layer stack 22', which is the remaining portion of multi-layer stack 22. The layers in the remaining portions 22' may be referred to as nanostructures hereinafter. The etching may be performed by any acceptable etch process, such as a Reactive Ion Etch (RIE), Neutral Beam Etch (NBE), the like, or a combination thereof. The etching may be anisotropic. Dummy semiconductor layers 24A and dummy nanostructures 24B may further be collectively referred to as dummy nanostructures 24.

The lower semiconductor nanostructures 26L will act as channel regions for lower nanostructure-FETs of the CFETs. The upper semiconductor nanostructures 26U will act as channel regions for upper nanostructure-FETs of the CFETs. The middle semiconductor nanostructures 26M are the semiconductor nanostructures that are immediately above/below (e.g., in contact with) the dummy nanostructures 24B. The middle semiconductor nanostructures 26M may be used for isolation and may or may not act as channel regions for the CFETs. The dummy nanostructures 24B will be subsequently replaced with dielectric isolation structures. The dielectric isolation structures and the middle semiconductor nanostructures 26M may define boundaries of the lower nanostructure-FETs and the upper nanostructure-FETs.

Isolation regions 32 are formed over the substrate 20 and between adjacent semiconductor strips 28. The respective process is illustrated as process 206 in the process flow 200 as shown in FIG. 19. Isolation regions 32 may include a dielectric liner and a dielectric material over the dielectric liner. Each of the dielectric liner and the dielectric material may include an oxide such as silicon oxide, a nitride, such as silicon nitride, the like, or a combination thereof. The formation of isolation regions 32 may include depositing the dielectric layer(s), and performing a planarization process such as a Chemical Mechanical Polish (CMP) process, a mechanical polishing process, or the like to remove excess portions of the dielectric materials. The deposition processes may include chemical vapor deposition (CVD), atomic layer deposition (ALD), HDP-CVD, Flowable Chemical Vapor Deposition (FCVD), the like, or a combination thereof. In accordance with some embodiments, the isolation regions 32 include silicon oxide formed by an FCVD process, followed by an anneal process.

After the planarization process, isolation regions 32 are recessed. Some upper portions of semiconductor strips 28 (including multi-layer stacks 22') protrude higher than the remaining isolation regions 32 to form protruding fins 34. The respective process is also illustrated as process 206 in the process flow 200 as shown in FIG. 19.

Dummy gate dielectric 36 is then formed on the protruding fins 34. Dummy gate dielectric 36 may be formed of or comprise, for example, silicon oxide, silicon nitride, a combination thereof, or the like, and may be deposited or thermally grown according to acceptable techniques. A dummy gate layer 38 is formed over the dummy gate dielectric 36. The dummy gate layer 38 may be deposited, for example, through Physical Vapor Deposition (PVD), CVD, or other techniques, and then planarized, such as by a CMP process. The material of dummy gate layer 38 may be conductive or non-conductive, and may be selected from a group including amorphous silicon, polycrystalline-silicon (polysilicon), poly-crystalline silicon-germanium (poly-SiGe), or the like. One or more mask layer(s) 40 is formed over the planarized dummy gate layer 38, and may include, for example, silicon nitride, silicon oxynitride, or the like.

Figure 3:
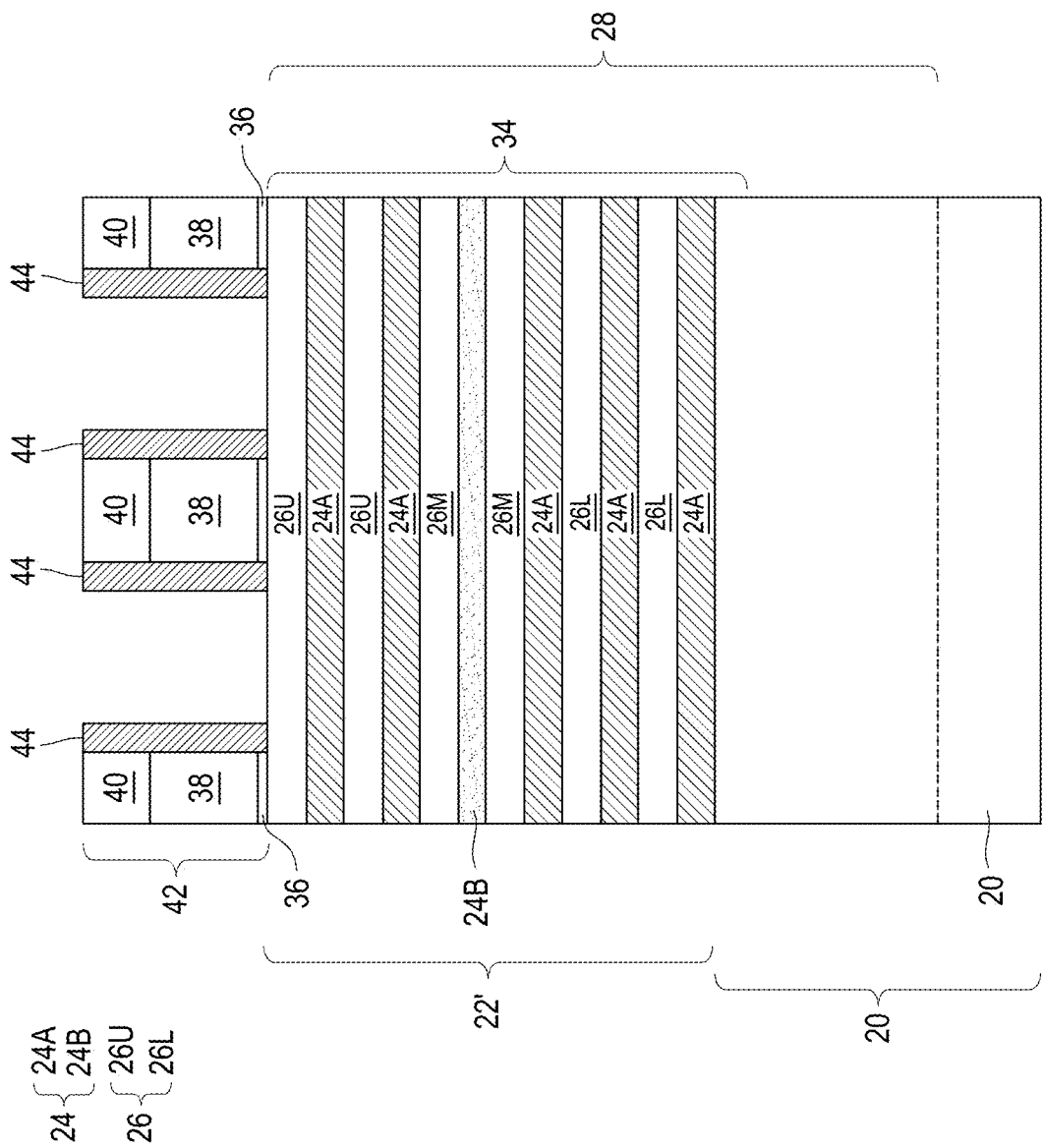

Next, the mask layer 40 may be patterned through photolithography and etching processes to form a mask, which is then used to etch and pattern dummy gate layer 38, and possibly dummy gate dielectric 36. A resulting structure is shown in FIG. 3, which illustrates a vertical cross-section 3-3 in FIG. 2, which cross-section is along the lengthwise direction of semiconductor strip 28. The remaining portions of mask layer 40, dummy gate layer 38, and dummy gate dielectric 36 form dummy gate stacks 42 as shown in FIG. 3. The respective process is illustrated as process 208 in the process flow 200 as shown in FIG. 19.

Gate spacers 44 are then formed over the multi-layer stacks 22' and on the exposed sidewalls of dummy gate stacks 42. The respective process is illustrated as process 210 in the process flow 200 as shown in FIG. 19. The gate spacers 44 may be formed by conformally depositing one or more dielectric layers and subsequently etching the dielectric layers anisotropically. The applicable dielectric materials may include silicon oxide, silicon nitride, silicon oxynitride, silicon oxycarbonitride, or the like, which may be formed by a deposition process such as CVD, ALD, or the like.

Figure 4:
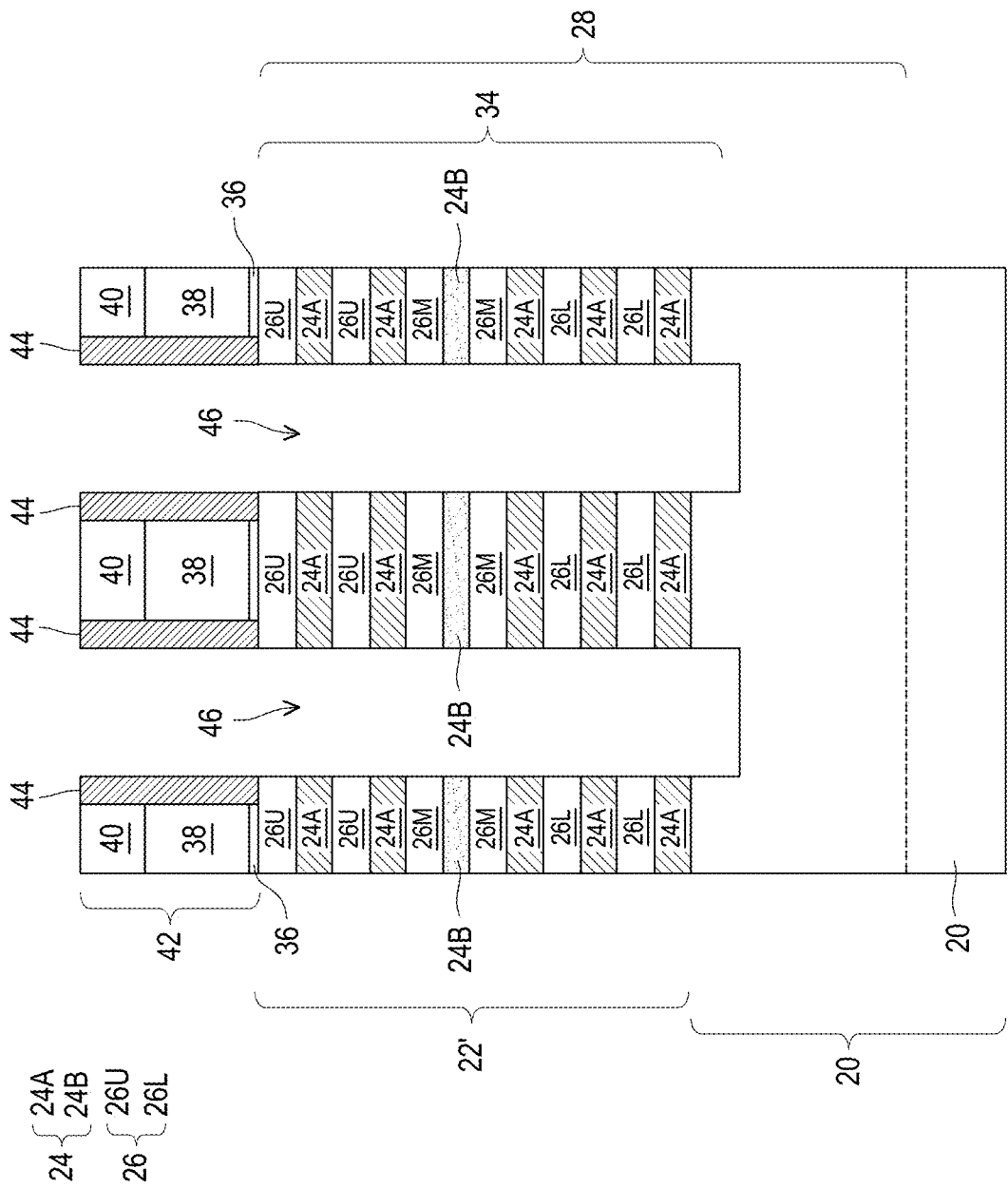

Referring to FIG. 4, source/drain recesses 46 are formed in semiconductor strips 28. The respective process is also illustrated as process 210 in the process flow 200 as shown in FIG. 19. The source/drain recesses 46 are formed through etching, and may extend through the multi-layer stacks 22' and into the semiconductor strips 20'. The bottom surfaces of the source/drain recesses 46 may be at a level above, below, or level with the top surfaces of the isolation regions 32 (not shown in FIG. 4). In the etching processes, the gate spacers 44 and the dummy gate stacks 42 mask some portions of the semiconductor strips 28. The etching may include a single etch process or multiple etch processes. Timed etch processes may be used to stop the etching of the source/drain recesses 46 upon source/drain recesses 46 reaching a desired depth.

Figure 5:
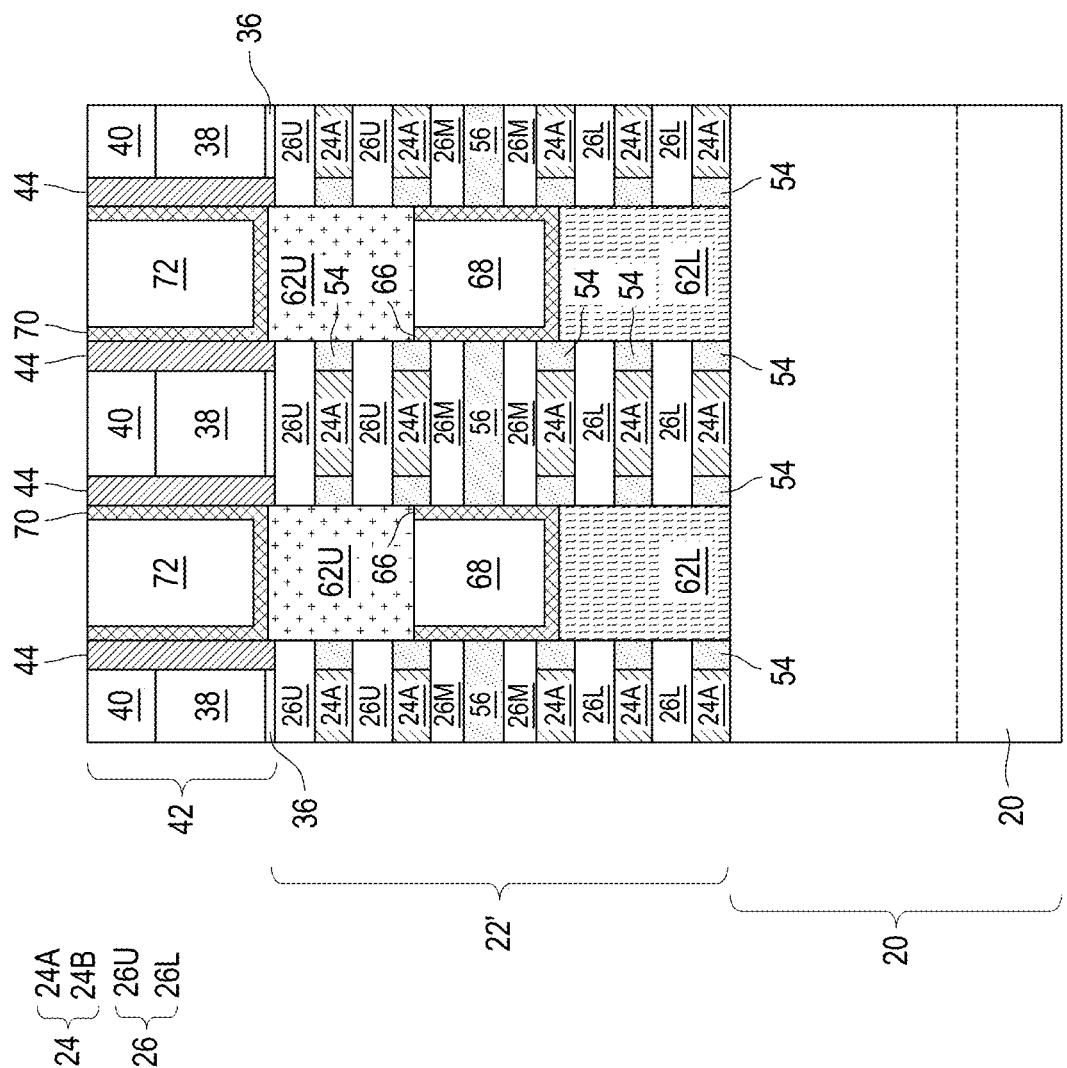
Figure 6:
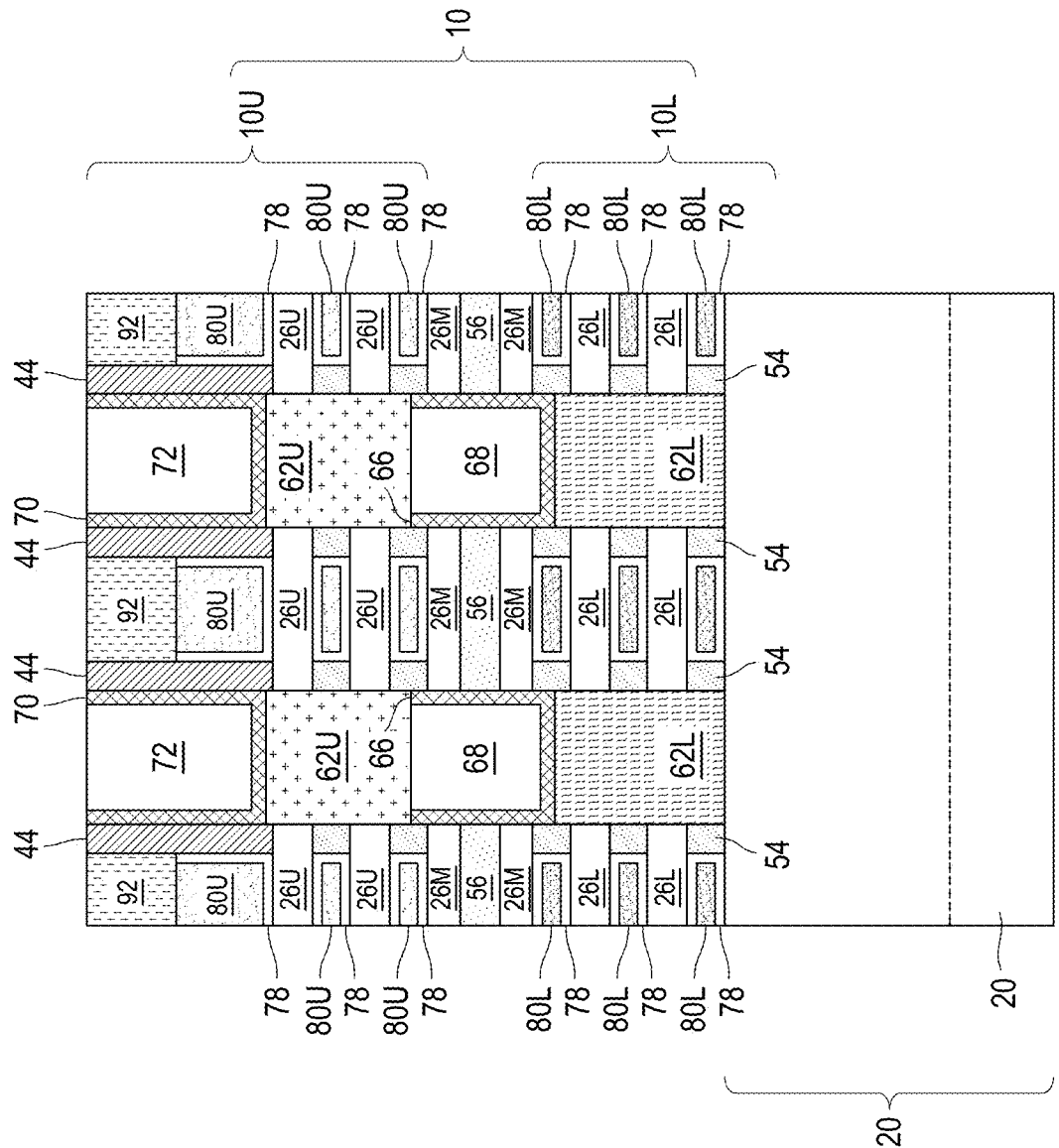

In FIG. 5, inner spacers 54 and dielectric isolation layers 56 are formed. The respective process is illustrated as process 212 in the process flow 200 as shown in FIG. 19. The formation of inner spacers 54 and dielectric isolation layers 56 may include an etching process that laterally etches the dummy semiconductor layers 24A and removes the dummy nanostructure 24B (FIG. 6).

The etching process may be isotropic and may be selective to the material of the dummy semiconductor layers 24A, so that the dummy semiconductor layers 24A are laterally etched at a faster rate than the semiconductor nanostructures 26U and 26L. The etching process may also be selective to the material of the dummy nanostructures 24B (FIG. 4), so that the dummy nanostructures 24B are etched at a faster rate than the dummy semiconductor layers 24A. In this manner, the dummy nanostructures 24B may be completely removed, while the dummy semiconductor layers 24A are laterally recessed.

In accordance with some embodiments in which the dummy nanostructures 24B are formed of germanium or silicon germanium with a high germanium atomic percentage, the dummy semiconductor layers 24A are formed of silicon germanium with a low germanium atomic percentage, and the semiconductor nanostructures 26 (including 26M (FIG. 4), 26U and 26L) are formed of silicon free from germanium, the etch process may comprise a dry etch process using chlorine gas, with or without a plasma.

Because the dummy gate stacks 42 are in contact with the sidewalls of the semiconductor nanostructures 26 (see FIG. 2), the dummy gate stacks 42 may support the upper semiconductor nanostructures 26U so that the upper semiconductor nanostructures 26U do not collapse upon the removal of the dummy nanostructures 24B. Further, although the sidewalls of the dummy semiconductor layers 24A are illustrated as being straight after the etching, the sidewalls may be concave or convex.

Inner spacers 54 are formed on the sidewalls of the laterally recessed dummy semiconductor layers 24A, and dielectric isolation layers 56 are formed between the upper semiconductor nanostructures 26U (collectively) and the lower semiconductor nanostructures 26L (collectively). In the subsequent formation of source/drain regions, the inner spacers 54 may act as isolation features between the subsequently formed source/drain regions and the subsequently formed gate structures. Further, the inner spacers 54 may be used to prevent damage to the subsequently formed source/drain regions by subsequent etch processes, such as the etch processes used to form gate structures. Dielectric isolation layers 56, on the other hand, are used to isolate the upper semiconductor nanostructures 26U (collectively) from the lower semiconductor nanostructures 26L (collectively). Furthermore, middle semiconductor nanostructures 26M and dielectric isolation layers 56 may define the boundaries of the lower transistors (nanostructure-FETs) and the upper transistors.

The inner spacers 54 and the dielectric isolation layers 56 may be formed by conformally depositing a dielectric insulating material in the source/drain recesses 46, and between the upper and lower semiconductor nanostructures 26U and 26L, and then etching the insulating material. The insulating material may be a non-low-k dielectric material, which may be a carbon-containing dielectric material such as silicon oxycarbonitride, silicon oxycarbide, silicon oxynitride, or the like. The insulating material may be formed by a deposition process, such as ALD, CVD, or the like. The etching of the insulating material may be anisotropic or isotropic. The insulating material, after being etched, has portions remaining on the sidewalls of the dummy semiconductor layers 24A (thus forming the inner spacers 54) and has portions remaining between the upper and lower semiconductor nanostructures 26U and 26L (thus forming the dielectric isolation layers 56).

Further referring to FIG. 5, lower epitaxial source/drain regions 62L are formed. The lower epitaxial source/drain regions 62L are formed in the lower portions of the source/drain recesses 46. The respective process is illustrated as process 214 in the process flow 200 as shown in FIG. 19. The lower epitaxial source/drain regions 62L are in contact with the lower semiconductor nanostructures 26L and are not in contact with the upper semiconductor nanostructures 26U. Inner spacers 54 electrically insulate the lower epitaxial source/drain regions 62L from the dummy semiconductor layers 24A, which will be replaced with replacement gates in subsequent processes.

The lower epitaxial source/drain regions 62L are epitaxially grown, and have a conductivity type that is suitable for the device type (p-type or n-type) of the lower nanostructure-FETs. When lower epitaxial source/drain regions 62L are n-type source/drain regions, the respective material may include silicon or carbon-doped silicon, which is doped with an n-type dopant such as phosphorous, arsenic, or the like. When lower epitaxial source/drain regions 62L are p-type source/drain regions, the respective material may include silicon or silicon germanium, which is doped with a p-type dopant such as boron, indium, or the like.

The lower epitaxial source/drain regions 62L may be in-situ doped, and may be, or may not be, implanted with the corresponding p-type or n-type dopants. During the epitaxy of the lower epitaxial source/drain regions 62L, the upper semiconductor nanostructures 26U may be masked to prevent undesired epitaxial growth on the upper semiconductor nanostructures 26U. After the lower epitaxial source/drain regions 62L are grown, the masks on the upper semiconductor nanostructures 26U are removed.

A first Contact Etch Stop Layer (CESL) 66 and a first Inter-Layer Dielectric (ILD) 68 are formed over the lower epitaxial source/drain regions 62L. The first CESL 66 may be formed of a dielectric material having a high etching selectivity from the etching of the first ILD 68, such as silicon nitride, silicon oxide, silicon oxynitride, or the like, which may be formed by any suitable deposition process, such as CVD, ALD, or the like. The first ILD 68 may be formed of a dielectric material, which may be deposited by any suitable method, such as CVD, plasma-enhanced CVD (PECVD), or FCVD. The applicable dielectric material of the first ILD 68 may include phospho-silicate glass (PSG), boro-silicate glass (BSG), boron-doped phospho-silicate glass (BPSG), undoped silicate glass (USG), silicon oxide, or the like.

The formation processes may include depositing a conformal CESL layer, depositing a material for the first ILD 68, followed by a planarization process and then an etch-back process. In accordance with some embodiments, the first ILD 68 is etched first, leaving the first CESL 66 unetched. An anisotropic etching process is then performed to remove the portions of the first CESL 66 higher than the recessed first ILD 68. After the recessing, the sidewalls of the upper semiconductor nanostructures 26U are exposed.

Upper epitaxial source/drain regions 62U are then formed in the upper portions of the source/drain recesses 46. The respective process is also illustrated as process 214 in the process flow 200 as shown in FIG. 19. The upper epitaxial source/drain regions 62U may be epitaxially grown from exposed surfaces of the upper semiconductor nanostructures 26U. The epitaxy of lower source/drain region 62L and upper source/drain region 62U may be performed at wafer temperatures in the range between about 450° C. and about 600° C. Also, an etching gas such as hydrogen chloride (HCl) may be adopted to achieve selective growth from nanostructures 26, but not from dielectric materials.

The materials of upper epitaxial source/drain regions 62U may be selected from the same candidate group of materials for forming lower source/drain regions 62L, depending on the desired conductivity type of upper epitaxial source/drain regions 62U.

The conductivity type of the upper epitaxial source/drain regions 62U may be opposite the conductivity type of the lower epitaxial source/drain regions 62L. For example, the upper epitaxial source/drain regions 62U may be oppositely doped than the lower epitaxial source/drain regions 62L. The upper epitaxial source/drain regions 62U may be in-situ doped, and/or may be implanted, with an n-type or p-type dopant. Adjacent upper source/drain regions 62U may remain separated after the epitaxy process or may be merged.

After the epitaxial source/drain regions 62U are formed, a second CESL 70 and a second ILD 72 are formed. The materials and the formation methods may be similar to the materials and the formation methods of first CESL 66 and first ILD 68, respectively, and are not discussed in detail herein. The formation process may include depositing the layers for CESL 70 and ILD 72, and performing a planarization process to remove the excess portion of the corresponding layers. After the planarization process, top surfaces of the second ILD 72, the gate spacers 44, and the dummy gate stacks 42 are coplanar (within process variations). The planarization process may remove masks 40, or leave hard masks 40 unremoved.

The dummy gate stacks 42 as shown in FIG. 5 are then removed in one or more etching steps, so that recesses are formed between the gate spacers 44, and extend to a level lower than multi-layer stacks 22'. The sidewalls of multi-layer stacks 22' are thus exposed, and the sidewalls of nanostructures 26U and 26L and dummy semiconductor layers 24A are exposed.

Dummy semiconductor layers 24A are then removed, so that the recesses extend laterally between semiconductor nanostructures 26U and 26L. In accordance with some embodiments, the dummy gate stacks 42 and the dummy dielectrics 36 are removed by isotropic etching processes. Dummy semiconductor layers 24A can be removed by any acceptable etch process that selectively etches the material of the dummy semiconductor layers 24A at a faster rate than the materials of the semiconductor nanostructures 26, the inner spacers 54, and the isolation structures 56. The etching may be isotropic.

In FIG. 6, replacement gate stacks 82 (including gate stacks 82U and 82L) are formed, which include gate dielectrics 78 and gate electrodes 80 (further including gate electrodes 80U and 80L). The respective process is illustrated as process 215 in the process flow 200 as shown in FIG. 19. Gate dielectrics 78 may be conformally formed on the channel regions of the semiconductor nanostructures 26. Each of the gate dielectrics 78 may include an interfacial layer (IL), which may be formed of or comprises an oxide such as silicon oxide or a metal oxide, a silicate such as a metal silicate, combinations thereof, multi-layers thereof, or the like. Each of the gate dielectrics 78 may also include a high dielectric constant (high-k) dielectric layer formed of a high-k dielectric material having a k-value greater than 3.9. The high-k dielectric material may comprise a metal oxide or a metal nitride of metals such as hafnium, aluminum, zirconium, lanthanum, manganese, barium, titanium, and lead. The formation methods of the gate dielectrics 78 may include molecular-beam deposition (MBD), ALD, PECVD, and the like.

Further referring to FIG. 6, lower gate electrodes 80L are formed on the gate dielectrics 78. The lower gate electrodes 80L are disposed between the lower semiconductor nanostructures 26L. Accordingly, the lower gate electrodes 80L also wrap around the lower semiconductor nanostructures 26L. Upper gate electrodes 80U are formed on the gate dielectrics 78. The upper gate electrodes 80U are disposed between the upper semiconductor nanostructures 26U. Accordingly, the upper gate electrodes 80U also wrap around the upper semiconductor nanostructures 26U.

Lower gate electrodes 80L and upper gate electrodes 80U may include adhesion layers, work-function layers, a filling metal, or the like. The materials of the work-function layers are selected based on the conductivity type of the respective FET. For example, for an n-type FET, n-type work function materials such as TiAl, TiAlN, or the like may be used to form the work-function layer. For a p-type FET, p-type work function materials such as TiN may be used to form the work-function layer. In accordance with some embodiments, the upper gate electrodes 80U may be recessed to form recesses between opposing gate spacers 44, followed by filling a dielectric material into the recesses to form gate hard masks (not shown). The structure shown in FIG. 6 includes lower transistor 10L and upper transistors 10U, which collectively form CFET 10.

Figure 7B:
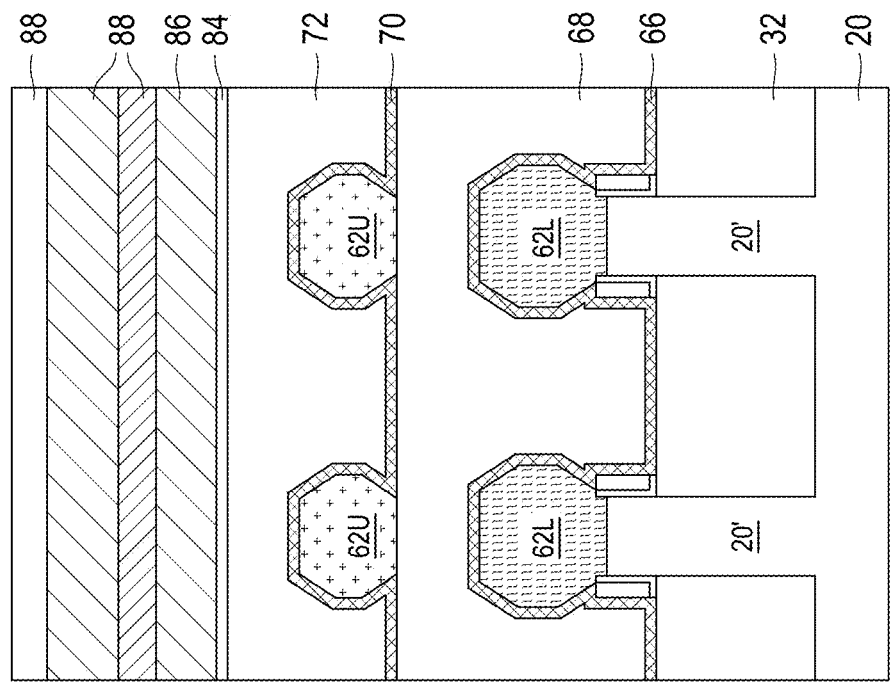
Figure 7A:
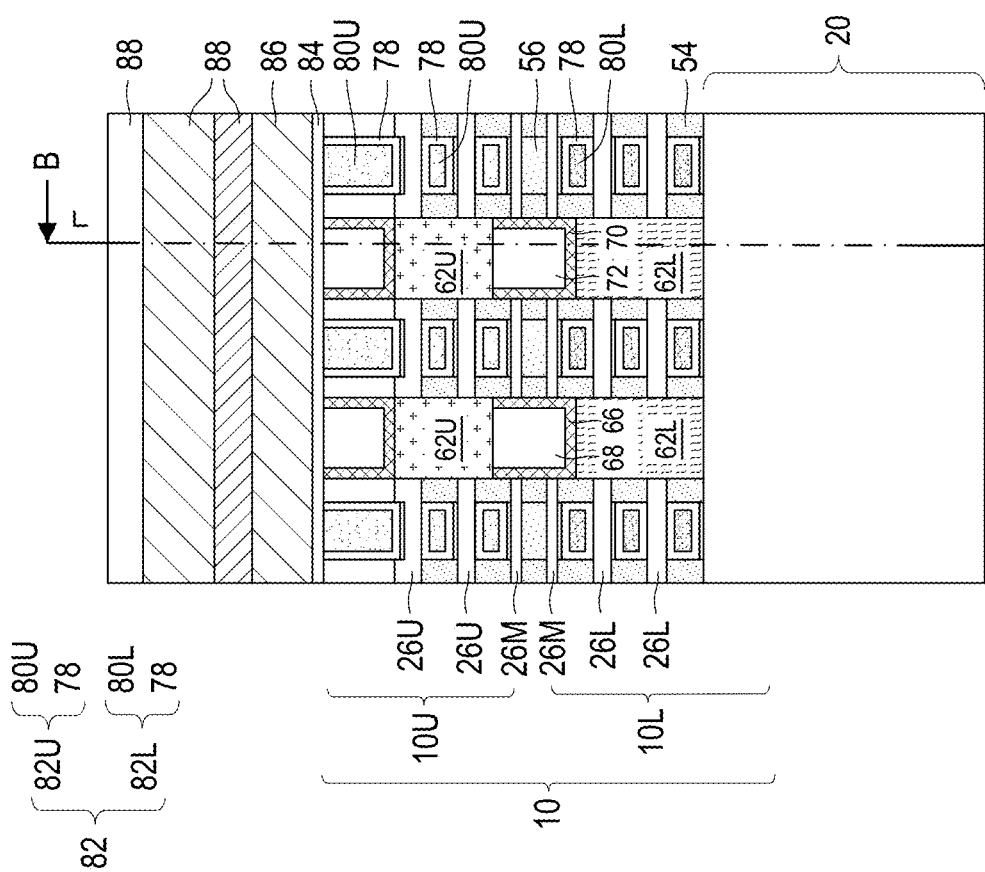

FIGS. 7A and 7B through FIGS. 18A and 18B illustrate the formation of a local interconnect for electrically connecting the lower source/drain regions 62L to the upper source/drain regions 62U in accordance with some embodiments. Referring to FIGS. 7A and 7B, CESL 84, ILD 86, and hard masks 88 are formed. FIG. 7B illustrates the vertical cross-section B-B in FIG. 7A.

In accordance with some embodiments, CESL 84 and ILD 86 are formed using similar or same materials as that of CESL 70 and ILD 72, respectively. The respective process is also illustrated as process 216 in the process flow 200 as shown in FIG. 19. Hard masks 88 may be formed of amorphous silicon (a-Si), tungsten doped carbide (WDC), SiN, TIN, BN, or the like, or multi-layers thereof. In accordance with an embodiment, the top layer of hard masks 88 comprises α-Si, and the bottom layer of hard masks 88 comprises WDC.

Figure 8B:
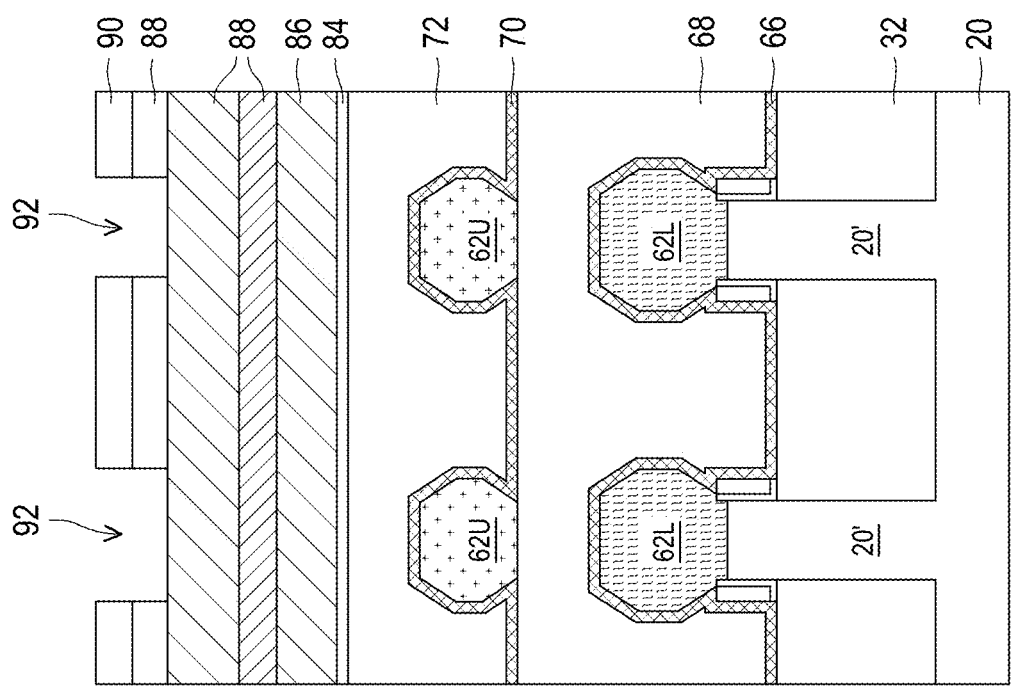
Figure 8A:
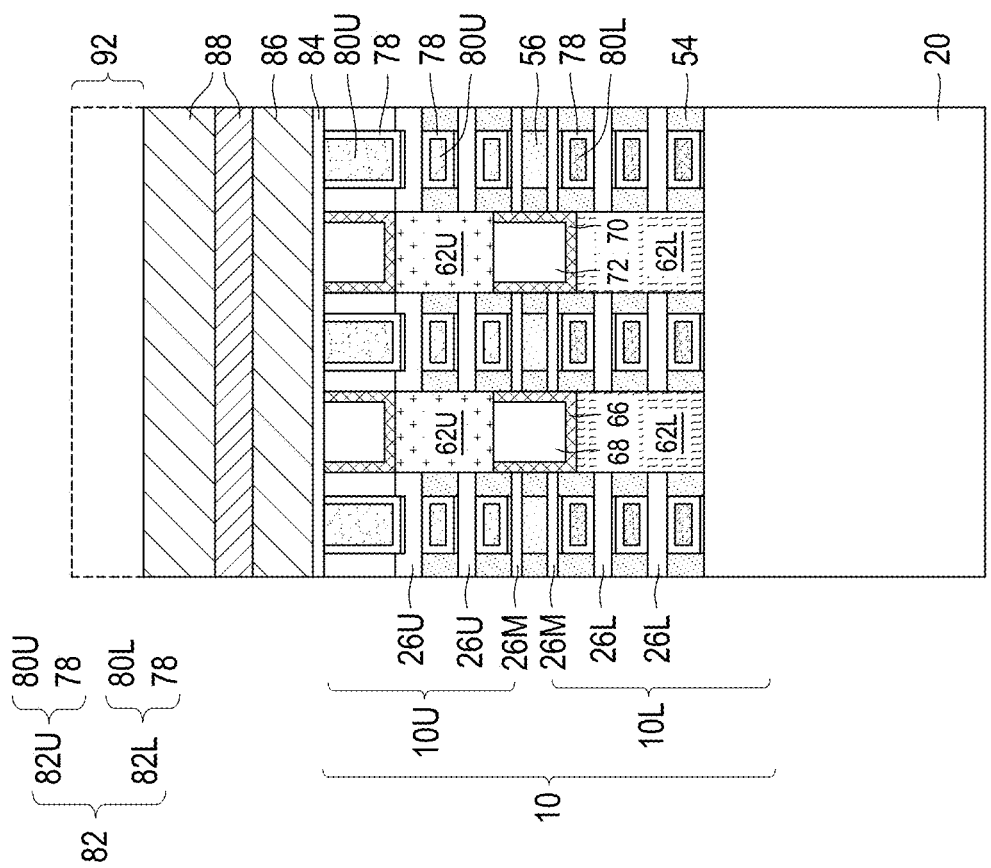
Figure 9B:
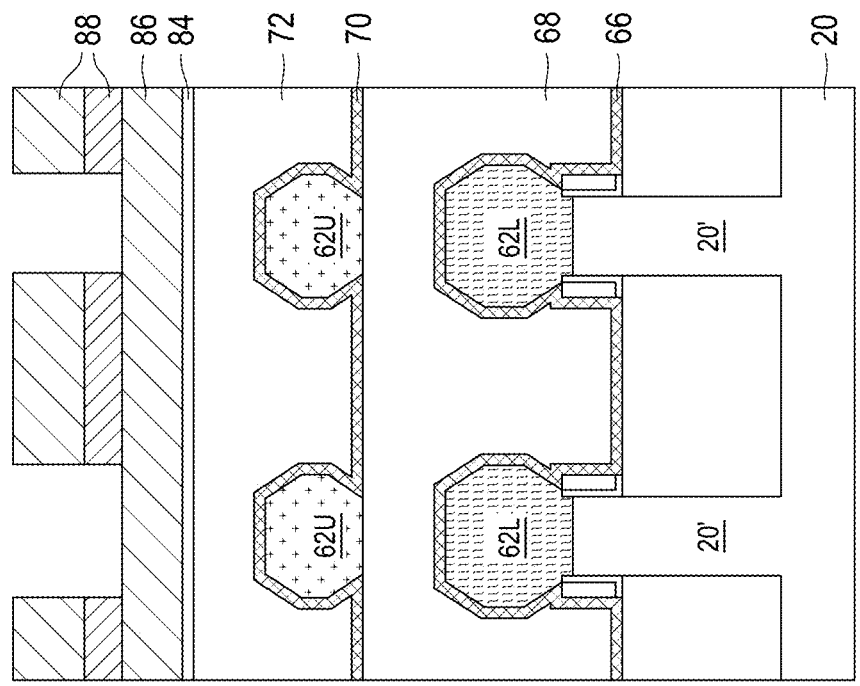
Figure 9A:
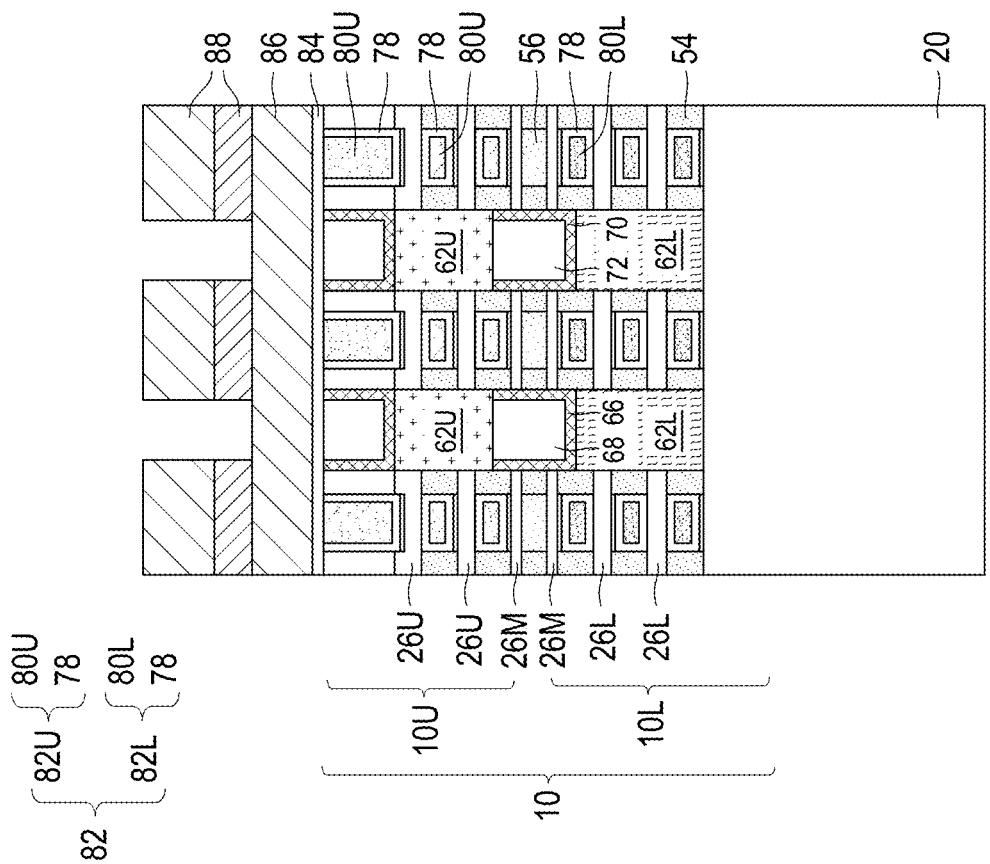

FIGS. 8A and 8B illustrate the formation and the patterning of etching mask 90, which may include a photoresist, and may or may not include a Bottom Anti-Reflective Coating (BARC) in accordance with some embodiments. Openings 92 are formed in etching mask 90 in accordance with some embodiments. The top layer of hard mask 88 is then etched using etching mask 90 to define patterns, followed by the removal of the remaining etching mask 90. After the etching, a layer of hard mask 88, for example, the top layer formed of amorphous silicon, is removed. The resulting structure is shown in FIGS. 9A and 9B.

Figure 10B:
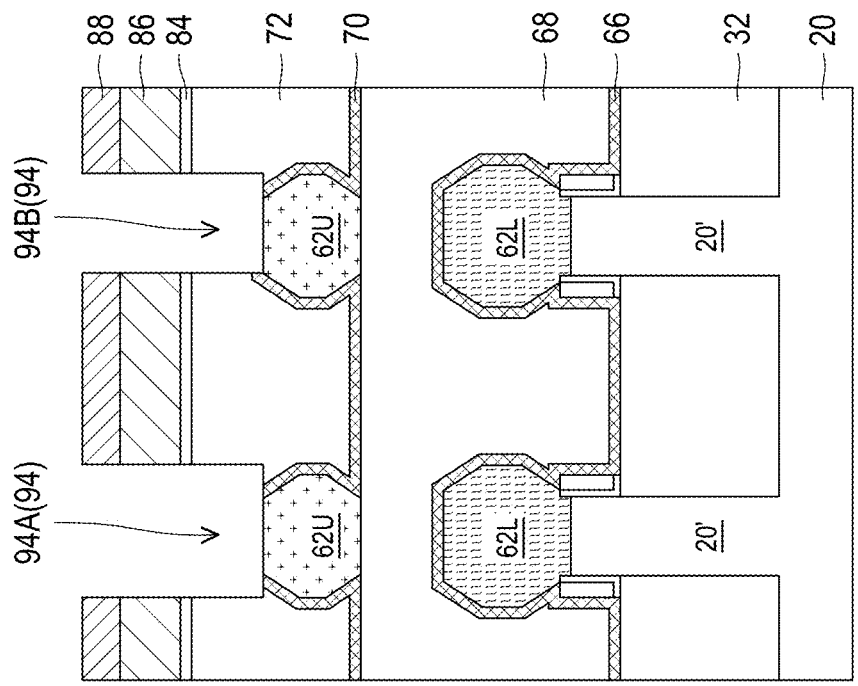
Figure 10A:
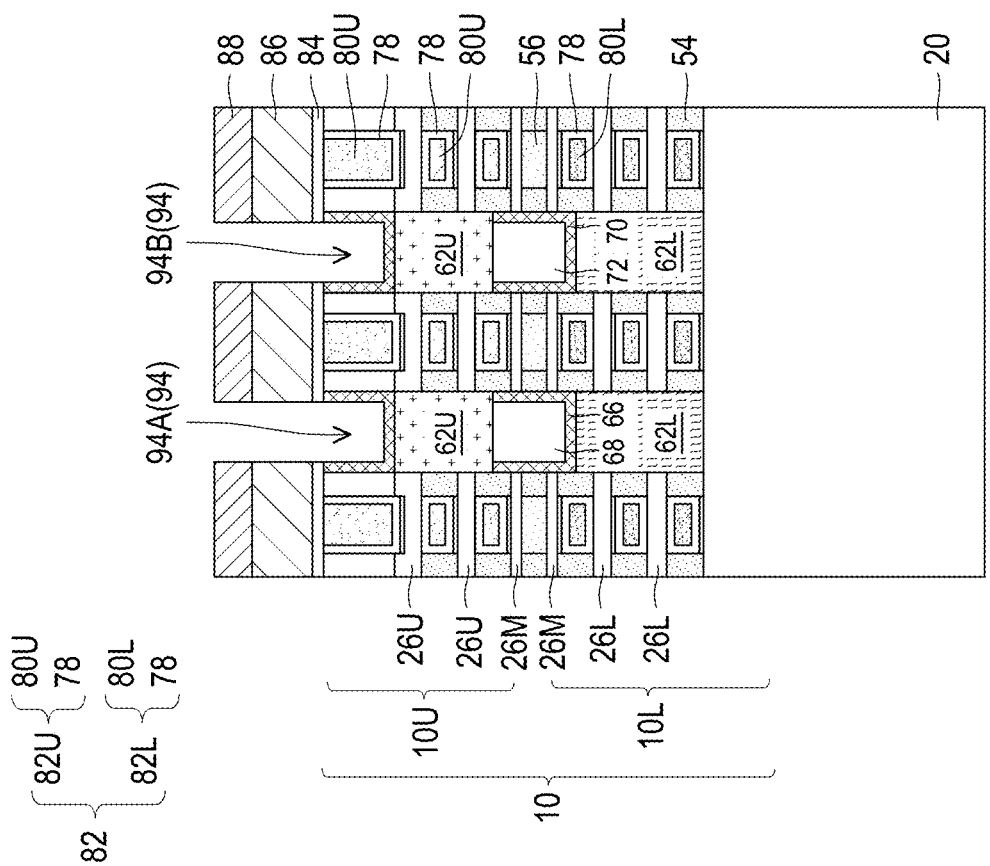

Referring to FIGS. 10A and 10B, ILD 86, CESL 84, ILD 72, and CESL 70 are etched to form openings 94, revealing the underlying upper source/drain regions 62U. Hard masks 88 are used as the etching masks. The respective process is also illustrated as process 218 in the process flow 200 as shown in FIG. 19. Openings 94 include opening 94A, which is used for forming a contact plug to connect to upper source/drain region 62U. Openings 94 further includes opening 94B, which is used for forming a contact plug (also referred to as a local interconnect) that electrically interconnects lower source/drain region 62L and upper source/drain region 62U.

FIGS. 11A and 11B illustrate the formation of contact spacers 101 (liners) in accordance with some embodiments. Contact spacers 101 may be formed by depositing a conformal dielectric layer using a conformal deposition process such as ALD, CVD, or the like, and performing an anisotropic etching process to remove the horizontal portions of the dielectric liner. Contact spacers 101 may be formed of or comprise silicon nitride (SiN), while other dielectric materials such as SiC, SiON, SiCN, or the like may also be used.

FIGS. 11A and 11B further illustrate an etching process to extend opening 94B down to lower sourced/drain region 62L. The respective process is also illustrated as process 220 in the process flow 200 as shown in FIG. 19. In accordance with some embodiments, a BARC 96 is formed to fill openings 94. BARC 96 may be a polymer, and may be a cross-linked photoresist in accordance with some embodiments. BARC 96 is etched using another etching mask (not shown), which may be a patterned photoresist in accordance with some embodiments.

Next, upper source/drain region 62U is etched-through, followed by the etching of ILD 68 and CESL 66, hence opening 94 extends to lower source/drain region 62L. In the etching process, the remaining hard mask 88 may be used for stopping the etching and defining the positions of some sidewalls (FIG. 11B, the rightmost sidewall of BARC 96) of opening 94B. Lower source/drain region 62L is exposed.

Subsequently, the BARC 96 is removed, followed by the formation of sacrificial layer 102 as shown in FIGS. 12A and 12B. In accordance with some embodiments, sacrificial layer 102 is formed of another BARC material such as a cross-linked photoresist, while other materials that have enough etching selectivity relative to ILD 86, CESL 84, upper source/drain regions 62U, and lower source/drain regions 62L may be used. Sacrificial layer 102 is formed as having a planar top surface, and is then etched back, so that its top surface is low than the top surface of ILD 86. The remaining hard mask 88 (FIGS. 11A and 11B), which may include a WDC layer, is then removed in an etching process, in which sacrificial layer 102 is used to protect the exposed upper source/drain regions 62U and lower source/drain regions 62L.

In accordance with some embodiments, the top corners of contact spacers 101 and ILD 86 are rounded through, for example, an isotropic etching process. The respective process is also referred to as Top Corner Rounding (TCR). Accordingly, the top portions of openings 94 are is enlarged and rounded, so that subsequent processes may be performed with less difficulty. Sacrificial layer 102 is then removed, for example, through an etching process.

Figures 13A, 13B:
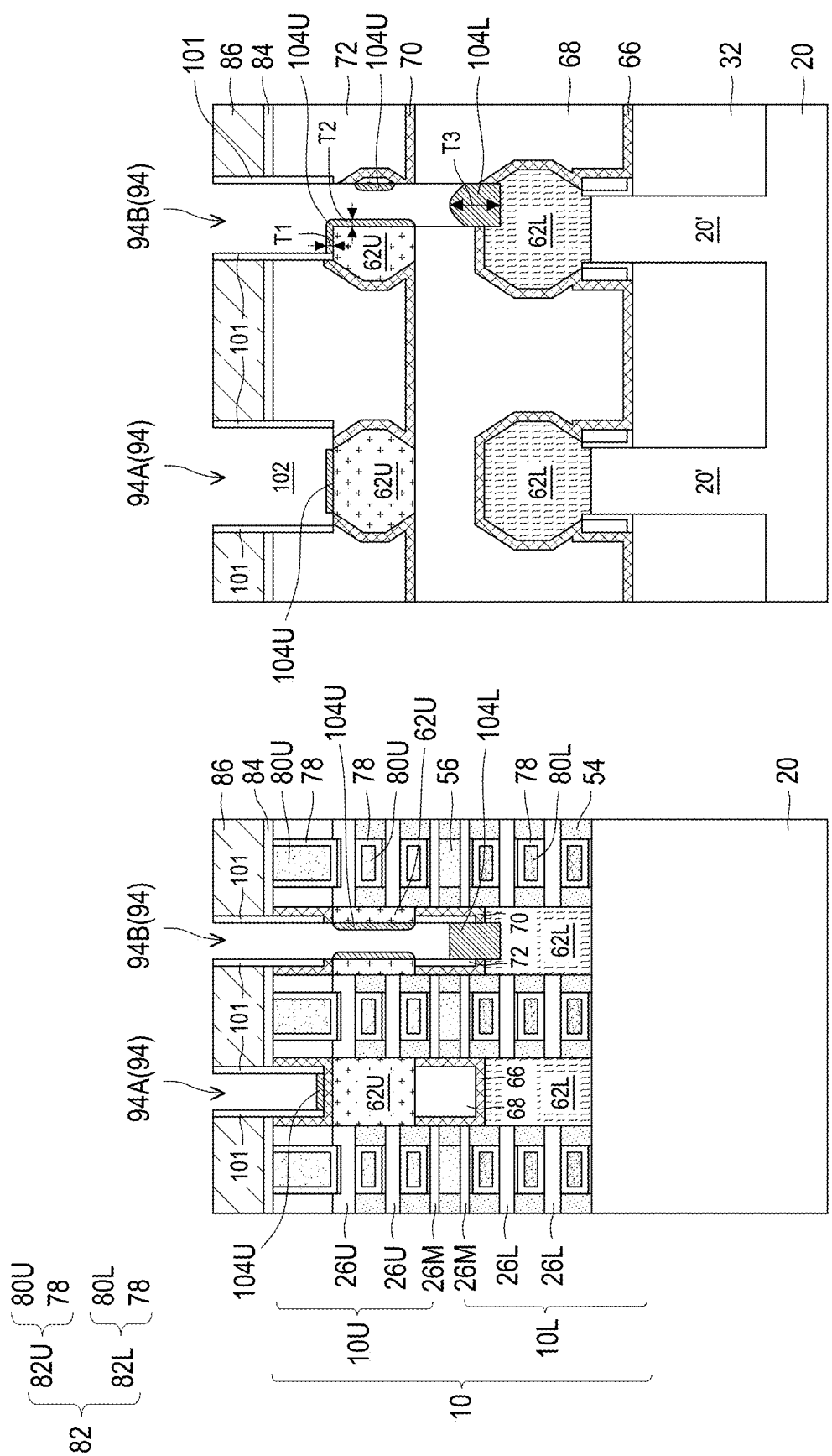

FIGS. 13A and 13B illustrate a deposition process to selectively deposit semiconductor layers 104U and 104L (referred to collectively as semiconductor layers 104) on the exposed surfaces of upper source/drain region 62U and lower source/drain region 62L, respectively. The respective process is also illustrated as process 222 in the process flow 200 as shown in FIG. 19. In accordance with some embodiments, the deposition process is an epitaxy process. The formation of semiconductor layers 104U and 104L may be performed at a temperature lower than the wafer temperature range used for the epitaxy of lower source/drain region 62L and upper source/drain region 62U. This may advantageously reduce the thermal budget since high-temperature growth at this stage may cause damage. For example, the low-temperature epitaxy of semiconductor layers 104U and 104L may be performed at a temperature in the range between about 200° C. and about 400° C., which is lower than the temperature range (for example, between about 450° C. and about 600° C.) in the epitaxy of lower source/drain region 62L and upper source/drain region 62U.

With the low-temperature growth, the selectivity, which is the ratio of the semiconductor growth rate on semiconductor regions to the growth rate on dielectric materials, is disadvantageously lowered. To solve this issue, the flow rate of an etching gas, which is used for removing the grown semiconductor layers 104 on dielectric, is increased, and may be increase to two times, three times, five times, or more, the flow rate of the etching gas used in the epitaxy of lower source/drain region 62L and upper source/drain region 62U. Increasing the flow rate of the etching gas may also make the vertical growth rate to be higher than the horizontal growth rate, and make the growth of semiconductor layers 104 to be more bottom-up. This is advantageous. For example, the thicknesses T1 and T3 of the vertically grown portions are greater than the thickness T2 of the sidewall portions, with T1/T2 (and T3/T2) being greater than about 1.5, greater than about 2, greater than about 5, or even greater.

Furthermore, since low temperature is used, and the growth selectivity is reduced, a chlorine-containing precursor, which provides silicon, is used to increase the growth selectivity. For example, trichlorosilane ($SiH_3Cl$, TCS), Dichlorosilane ($SiH_2Cl_2$, DCS), and/or $SiH_3Cl$ may be used as the silicon precursor. These precursors have higher activation energies Ea than silane ($SiH_4$), and it is more difficult for Si to have nucleation on surfaces of dielectric materials. This combined with the higher flow rate of etching gas may improve the selectivity of growth.

In accordance with some embodiments, semiconductor layers 104 have crystalline structures. Alternatively, due to the low growth temperature, semiconductor layers 104 may have polysilicon structures.

In accordance with some embodiments, semiconductor layers 104 is formed of a similar material, and may have the same dopant type as, that of lower source/drain regions 62L. For example, when lower source/drain regions 62L is a p-type region comprising SiGeB, semiconductor layers 104 may also be in-situ doped with boron, and may be formed of SiGeB. In an example embodiment, the germanium atomic percentage in semiconductor layers 104 may be in the range between about 20 percent and about 60 percentage. The boron concentration may be in the range between about $1E20/cm^3$ and about $9E20/cm^3$ in accordance with some embodiments. Alternatively, if lower source/drain regions 62L is an n-type region comprising SiP, semiconductor layers 104 may also be formed of SiP.

Figures 14A, 14B:
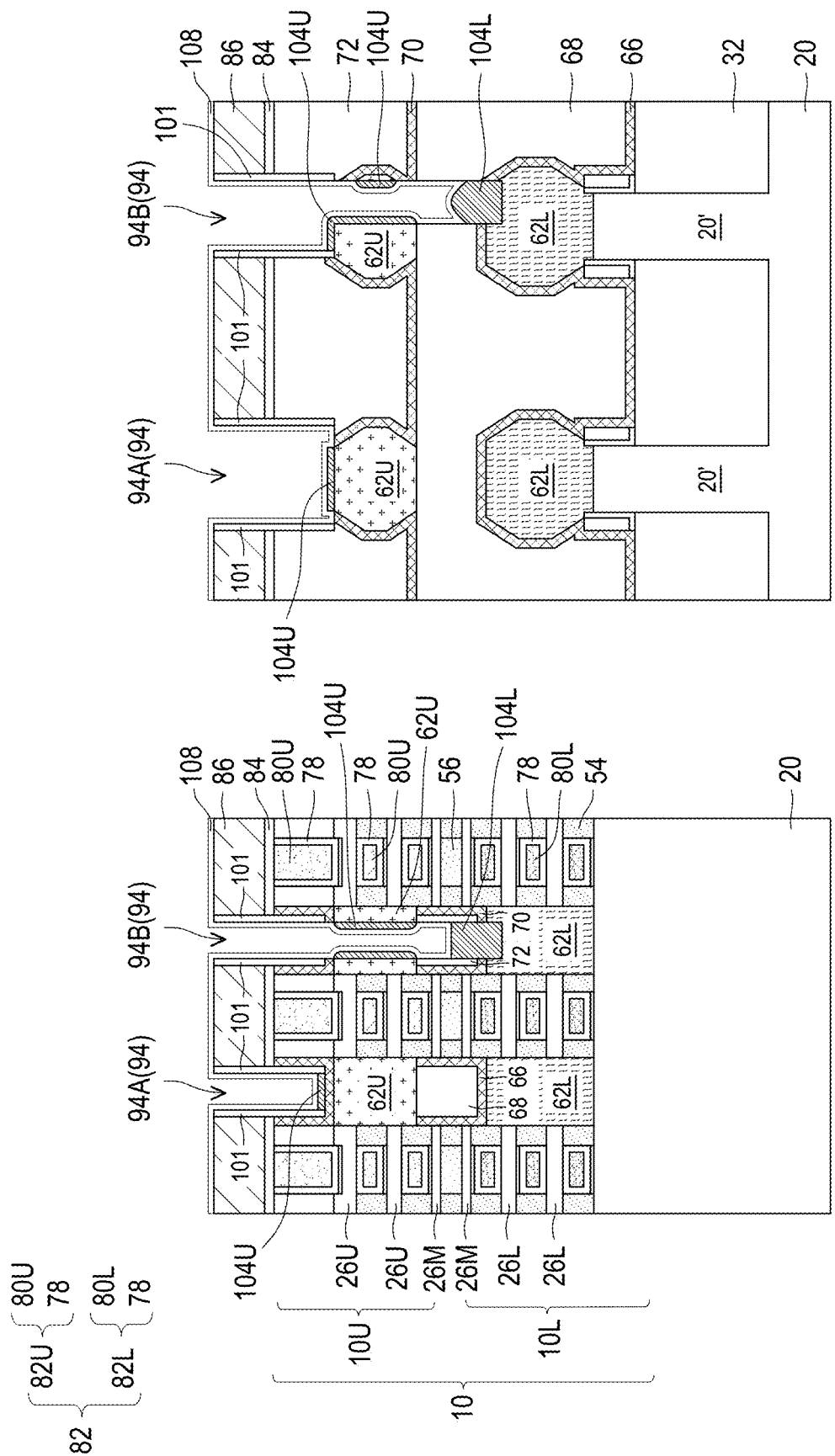

FIGS. 14A and 14B illustrate the formation of protection liner 108 through a conformal deposition process, for example, ALD or CVD. The respective process is also illustrated as process 224 in the process flow 200 as shown in FIG. 19. Protection liner 108 may be formed of or comprise a material having a high-etching selectivity to the materials it contacts. For example, Protection liner 108 may be formed of or comprises an oxide such as silicon oxide, AlN, AlO, TIN, SiC, or the like.

FIGS. 15A and 15B illustrate the formation of sacrificial layer 110 in accordance with some embodiments. The respective process is also illustrated as process 226 in the process flow 200 as shown in FIG. 19. In accordance with some embodiments, sacrificial layer 110 is formed of or comprises a polymer, which may also be a photoresist in accordance with some embodiments. In accordance with some embodiments, the formation process includes spin-coating and curing sacrificial layer 110. Sacrificial layer 110, which comprising a photoresist, may also be cross-linked by performing a light-exposure process. Sacrificial layer 110 is then etched back, so that its top surface is lower than the bottom end of semiconductor layers 104U. Semiconductor layer 104L is covered by sacrificial layer 110. The etch-back process may be performed using for, example, $H_2$, $N_2$, or the like, or combinations thereof as the etching gas.

Referring to FIGS. 16A and 16B, the exposed portions of protection liner 108 are etched, for example, in an isotropic etching process, which may be either a wet etching process or a dry etching process. The respective process is also illustrated as process 228 in the process flow 200 as shown in FIG. 19. Semiconductor layers 104U are thus revealed.

The exposed semiconductor layers 104U are then etched. The respective process is also illustrated as process 230 in the process flow 200 as shown in FIG. 19. The removal of protection liner 108 and semiconductor layers 104U may be performed using HCl or a chemical solution comprising NH$_4$OH, H$_2$O$_2$, and H$_2$O (sometimes referred to as Standard Clean 1 (SC1) solution), or a chemical solution comprising HCl, H$_2$O$_2$, and H$_2$O (sometimes referred to as Standard Clean 2 (SC2) solution).

Figure 17B:
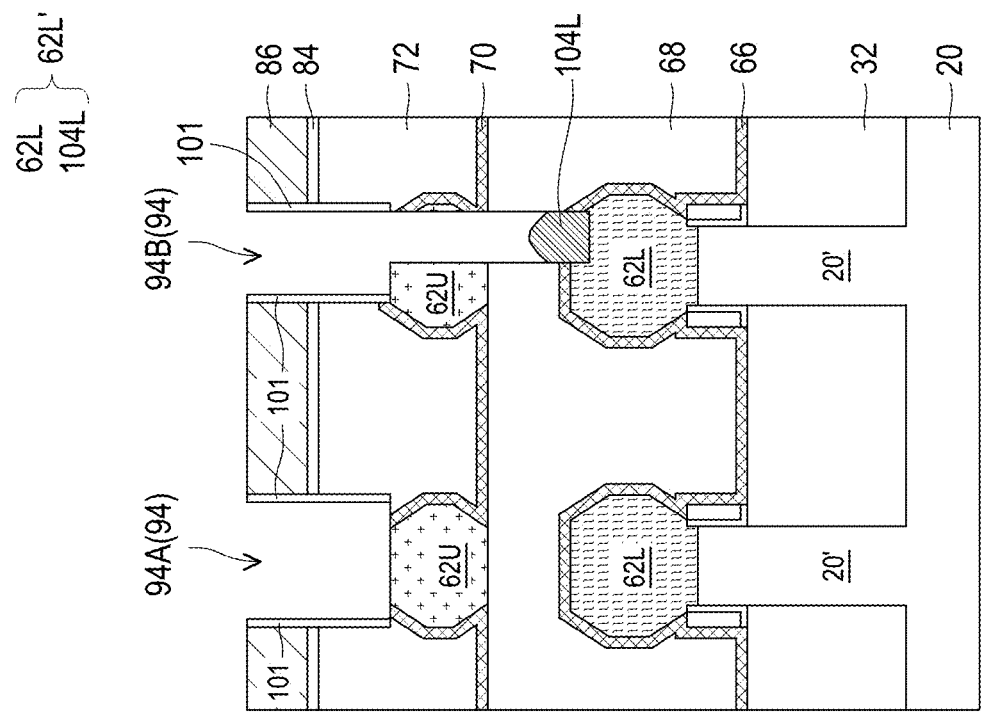
Figure 17A:
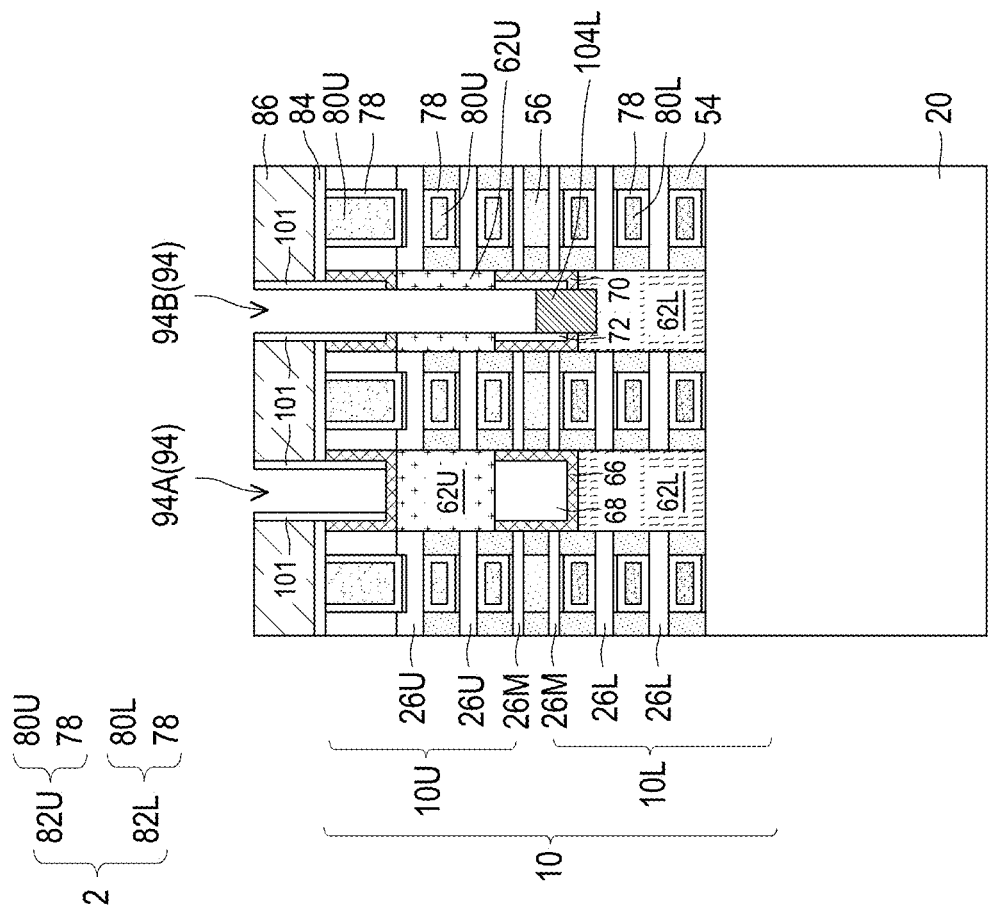

After the etching process, the remaining sacrificial layer 110 and protection liner 108 are removed, for example, in isotropic etching processes. The respective process is also illustrated as process 232 in the process flow 200 as shown in FIG. 19. The resulting structure is shown in FIGS. 17A and 17B. The processes as shown in FIGS. 11A and 11B through FIGS. 17A and 17B has the net effect of selectively forming semiconductor layer 104L on the lower source/drain region 62L, and semiconductor layer 104L becomes an extension portion of the lower source/drain region 62L. Throughout the description, the lower source/drain region 62U and semiconductor layer 104L are collectively referred to as lower source/drain regions 62L'. With the formation of lower semiconductor layer 104L, the aspect ratio of the opening 94B is reduced.

FIGS. 18A and 18B illustrate the formation of silicide layers 112L and 112U, and the formation of contact plugs 118 and 120. The respective process is also illustrated as process 234 in the process flow 200 as shown in FIG. 19. The formation of silicide layer 112L and 112U may include depositing a metal layer (such as a titanium layer or a cobalt layer) extending into openings 94, performing an annealing process to form silicide layers 112L and 112U, and removing the remaining metal layer, if any.

Contact plugs 118 and 120 are then formed, and may include barrier/adhesion layer 114 and metal region 116 on the adhesion layer 114. The respective process is also illustrated as process 236 in the process flow 200 as shown in FIG. 19. The barrier/adhesion layer 114 may comprise Ti, TiN, Ta, TaN, or the like. The metal region 116 may include tungsten, cobalt, or the like. The contact plugs 118 and 120 may also be barrier-less without barrier/adhesion layer therein.

Contact plug 120 is electrically connected to upper source/rain region 62U. Contact plug 118 is used as a local interconnect that electrically interconnects lower source/drain region 62' and upper source/drain region 62U.

The embodiments of the present disclosure have some advantageous features. By forming a semiconductor layer on the lower source/drain region, the aspect ratio of the opening for forming a local interconnect is reduced. Since the opening has high aspect ratio, and further because the upper silicide layers occupy the already narrow opening, it is difficult to form the deep local interconnect. In the embodiments of the present disclosure, with the reduction of the aspect ratio, the difficult in the formation of the local interconnect is reduced, and it is less likely to have void in the local interconnect.

In accordance with some embodiments of the present disclosure, a method comprises forming Complementary Field-Effect Transistors comprising a lower transistor comprising a lower source/drain region; and an upper transistor comprising an upper source/drain region; etching an upper dielectric layer over the upper source/drain region and a lower dielectric layer between the upper source/drain region and the lower source/drain region to form an opening, wherein a sidewall of the upper source/drain region and a top surface of the lower source/drain region are exposed to the opening; performing an epitaxy process to form a first semiconductor layer on the sidewall of the upper source/drain region; and a second semiconductor layer on the top surface of the lower source/drain region; removing the first semiconductor layer, with the second semiconductor layer being remaining, wherein the second semiconductor layer and the lower source/drain region collectively form a combined source/drain region; and forming a contact plug in the opening, wherein the contact plug electrically connects the upper source/drain region to the combined source/drain region.

In an embodiment, the upper source/drain region is of a first conductivity type, the lower source/drain region is of a second conductivity type opposite to the first conductivity type, and wherein in the epitaxy process, the first semiconductor layer and the second semiconductor layer are in-situ doped with a dopant of the second conductivity type. In an embodiment, the first semiconductor layer is removed by processes comprising forming a sacrificial layer to fill the opening; recessing the sacrificial layer, so that the first semiconductor layer is revealed, and the second semiconductor layer is covered by the sacrificial layer; etching the first semiconductor layer; and removing the sacrificial layer.

In an embodiment, the method further comprises depositing a protection liner extending into the opening, wherein the sacrificial layer is formed on the protection liner, and the method further comprises, after the sacrificial layer is recessed, etching portions of the protection liner higher than the sacrificial layer, wherein the protection liner is also removed after the first semiconductor layer is removed. In an embodiment, the method further comprises epitaxially growing the lower source/drain region and the upper source/drain region at a first wafer temperature, wherein the epitaxy process is performed at a second wafer temperature lower than the first wafer temperature. In an embodiment, the epitaxy process is performed at a wafer temperature in a range between about 200° C. and about 400° C.

In an embodiment, the epitaxy process is performed using a chlorine-containing silicon precursor. In an embodiment, the epitaxy process is performed with a vertical growth rate being greater than a horizontal growth rate. In an embodiment, the epitaxy process is performed using an etching gas having a first flow rate, and one of the lower source/drain region and the upper source/drain region is epitaxially grown using the etching gas having a second flow rate, and the first flow rate is greater than the second flow rate. In an embodiment, the etching gas comprises hydrogen chloride (HCl), and a ratio of the first flow rate to the second flow rate is greater than about 2. In an embodiment, the method further comprises, before the contact plug is formed, forming a lower silicide layer on the second semiconductor layer; and forming an upper silicide layer on the sidewall of the upper source/drain region.

In accordance with some embodiments of the present disclosure, a device comprises a lower transistor comprising a lower source/drain region, and the lower source/drain region comprises a lower portion; and an upper portion over and joined to the upper portion; a lower CESL on the lower portion of the lower source/drain region, wherein a first top surface of the upper portion of the lower source/drain region is higher than a second top surface of the lower CESL; a lower ILD over the lower CESL; a lower silicide layer on the first top surface of the upper portion of the lower source/drain region; an upper source/drain region overlapping the lower source/drain region; an upper silicide layer on the upper source/drain region; an upper CESL on the upper source/drain region; an upper ILD over the upper CESL; and a contact plug contacting both of the upper silicide layer and the lower silicide layer.

In an embodiment, both of the lower portion and the upper portion of the lower source/drain region are of a same conductivity type. In an embodiment, the upper portion of the lower source/drain region is lower than a top surface of the lower ILD. In an embodiment, a first sidewall of the upper portion of the lower source/drain region is substantially vertical and substantially straight. In an embodiment, a portion of the contact plug in the lower ILD comprises a second sidewall vertically aligned to the first sidewall.

In accordance with some embodiments of the present disclosure, device comprises Complementary Field-Effect Transistors comprising a lower transistor comprising a lower source/drain region, and the lower source/drain region comprises a lower portion and an upper portion over the lower portion; and an upper transistor comprising an upper source/drain region; a lower contact etch stop layer on the lower portion of the lower source/drain region, wherein the upper portion of the lower source/drain region penetrates through the lower contact etch stop layer; a lower silicide layer on a top surface of the upper portion of the lower source/drain region; an upper silicide layer on a sidewall of the upper source/drain region; and a contact plug contacting the upper silicide layer and the lower silicide layer.

In an embodiment, first edges of the upper portion of the lower source/drain region are vertically aligned to respective second edges of a lower part of the contact plug. In an embodiment, the upper portion of the lower source/drain region has a same top view shape as the lower part of the contact plug. In an embodiment, the device further comprises a lower inter-layer dielectric on the lower contact etch stop layer, wherein the top surface of the upper portion of the lower source/drain region is at an intermediate level between an additional top surface and a bottom surface of the lower inter-layer dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming Complementary Field-Effect Transistors comprising:
        a lower transistor comprising a lower source/drain region; and
        an upper transistor comprising an upper source/drain region;
    etching an upper dielectric layer over the upper source/drain region and a lower dielectric layer between the upper source/drain region and the lower source/drain region to form an opening, wherein a sidewall of the upper source/drain region and a top surface of the lower source/drain region are exposed to the opening;
    performing an epitaxy process to form:
        a first semiconductor layer on the sidewall of the upper source/drain region; and
        a second semiconductor layer on the top surface of the lower source/drain region;
    removing the first semiconductor layer, with the second semiconductor layer being remaining, wherein the second semiconductor layer and the lower source/drain region collectively form a combined source/drain region; and
    forming a contact plug in the opening, wherein the contact plug electrically connects the upper source/drain region to the combined source/drain region.

2. The method of claim 1, wherein the upper source/drain region is of a first conductivity type, the lower source/drain region is of a second conductivity type opposite to the first conductivity type, and wherein in the epitaxy process, the first semiconductor layer and the second semiconductor layer are in-situ doped with a dopant of the second conductivity type.

3. The method of claim 1, wherein the first semiconductor layer is removed by processes comprising:
    forming a sacrificial layer to fill the opening;
    recessing the sacrificial layer, so that the first semiconductor layer is revealed, and the second semiconductor layer is covered by the sacrificial layer;
    etching the first semiconductor layer; and
    removing the sacrificial layer.

4. The method of claim 3 further comprising depositing a protection liner extending into the opening, wherein the sacrificial layer is formed on the protection liner, and the method further comprises, after the sacrificial layer is recessed, etching portions of the protection liner higher than the sacrificial layer, wherein the protection liner is also removed after the first semiconductor layer is removed.

5. The method of claim 1 further comprising:
    epitaxially growing the lower source/drain region and the upper source/drain region at a first wafer temperature, wherein the epitaxy process is performed at a second wafer temperature lower than the first wafer temperature.

6. The method of claim 1, wherein the epitaxy process is performed at a wafer temperature in a range between about 200° C. and about 400° C.

7. The method of claim 1, wherein the epitaxy process is performed using a chlorine-containing silicon precursor.

8. The method of claim 1, wherein the epitaxy process is performed with a vertical growth rate being greater than a horizontal growth rate.

9. The method of claim 1, wherein the epitaxy process is performed using an etching gas having a first flow rate, and one of the lower source/drain region and the upper source/drain region is epitaxially grown using the etching gas having a second flow rate, and the first flow rate is greater than the second flow rate.

10. The method of claim 9, wherein the etching gas comprises hydrogen chloride (HCl), and a ratio of the first flow rate to the second flow rate is greater than about 2.

11. The method of claim 1 further comprising, before the contact plug is formed:
    forming a lower silicide layer on the second semiconductor layer; and
    forming an upper silicide layer on the sidewall of the upper source/drain region.

12. A device comprising:
    a lower transistor comprising a lower source/drain region, and the lower source/drain region comprises:
        a lower portion; and
        an upper portion over and joined to the lower portion;

a lower contact etch stop layer (CESL) on the lower portion of the lower source/drain region, wherein a first top surface of the upper portion of the lower source/drain region is higher than a second top surface of the lower CESL;

a lower inter-layer dielectric (ILD) over the lower CESL;

a lower silicide layer on the first top surface of the upper portion of the lower source/drain region;

an upper source/drain region overlapping the lower source/drain region;

an upper silicide layer on the upper source/drain region;

an upper CESL on the upper source/drain region;

an upper ILD over the upper CESL; and a contact plug contacting both of the upper silicide layer and the lower silicide layer.

13. The device of claim 12, wherein both of the lower portion and the upper portion of the lower source/drain region are of a same conductivity type.

14. The device of claim 12, wherein the upper portion of the lower source/drain region is lower than a top surface of the lower ILD.

15. The device of claim 12, wherein a first sidewall of the upper portion of the lower source/drain region is substantially vertical and substantially straight.

16. The device of claim 15, wherein a portion of the contact plug in the lower ILD comprises a second sidewall vertically aligned to the first sidewall.

17. A device comprising:

Complementary Field-Effect Transistors comprising:

a lower transistor comprising a lower source/drain region, and the lower source/drain region comprises a lower portion and an upper portion over the lower portion; and an upper transistor comprising an upper source/drain region;

a lower contact etch stop layer on the lower portion of the lower source/drain region, wherein the upper portion of the lower source/drain region penetrates through the lower contact etch stop layer;

a lower silicide layer on a top surface of the upper portion of the lower source/drain region;

an upper silicide layer on a sidewall of the upper source/drain region; and a contact plug contacting the upper silicide layer and the lower silicide layer.

18. The device of claim 17, wherein first edges of the upper portion of the lower source/drain region are vertically aligned to respective second edges of a lower part of the contact plug.

19. The device of claim 18, wherein the upper portion of the lower source/drain region has a same top view shape as the lower part of the contact plug.

20. The device of claim 18 further comprising a lower inter-layer dielectric on the lower contact etch stop layer, wherein the top surface of the upper portion of the lower source/drain region is at an intermediate level between an additional top surface and a bottom surface of the lower inter-layer dielectric.

\* \* \* \* \*